United States Patent
Kim et al.

(10) Patent No.: US 11,177,338 B2
(45) Date of Patent: Nov. 16, 2021

(54) DISPLAY DEVICE HAVING PERIPHERAL COMMON VOLTAGE LINE

(71) Applicant: Samsung Display Co., Ltd., Yongin-si (KR)

(72) Inventors: Dong-Hwi Kim, Osan-si (KR); Na-Young Kim, Seongnam-si (KR); Chul Ho Kim, Cheonan-si (KR); Wang Jo Lee, Suwon-si (KR); Jin Jeon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/780,665

(22) Filed: Feb. 3, 2020

(65) Prior Publication Data

US 2020/0328268 A1 Oct. 15, 2020

(30) Foreign Application Priority Data

Apr. 15, 2019 (KR) ........................ 10-2019-0043646

(51) Int. Cl.
  *H01L 27/32* (2006.01)
(52) U.S. Cl.
  CPC ................. *H01L 27/3276* (2013.01)
(58) Field of Classification Search
  CPC .................................................. H01L 27/3276
  See application file for complete search history.

(56) References Cited

U.S. PATENT DOCUMENTS

| | | | | |
|---|---|---|---|---|
| 2005/0001546 A1* | 1/2005 | Yamaguchi | ......... | H01L 51/5206 313/512 |
| 2005/0029937 A1* | 2/2005 | Kim | ................... | H01L 27/3276 313/506 |
| 2006/0001792 A1* | 1/2006 | Choi | ................... | H01L 27/3223 349/54 |
| 2006/0250083 A1* | 11/2006 | Oh | ...................... | H01L 27/3279 313/512 |
| 2007/0096135 A1* | 5/2007 | Matsumoto | ......... | H01L 27/3276 257/99 |
| 2008/0129898 A1* | 6/2008 | Moon | ................... | G06F 3/0418 349/12 |

(Continued)

FOREIGN PATENT DOCUMENTS

KR  10-0590259 B1  6/2006
KR  10-0624137 B1  9/2006

(Continued)

*Primary Examiner* — Lex H Malsawma
(74) *Attorney, Agent, or Firm* — Lewis Roca Rothgerber Christie LLP

(57) ABSTRACT

A display device includes: a substrate including a display area at which a pixel including a light emitting element is located and a peripheral area surrounding the display area; and a common voltage line on the substrate, the common voltage line configured to provide a common voltage to the pixel, the common voltage line including: a peripheral common voltage line on the peripheral area of the substrate to surround the display area and connected to a common electrode of the light emitting element; and a plurality of display common voltage lines crossing the display area and each contacting different portions of the peripheral common voltage line, the display common voltage lines being spaced apart from the common electrode of the light emitting element.

19 Claims, 17 Drawing Sheets

(56) References Cited

U.S. PATENT DOCUMENTS

| | | | | |
|---|---|---|---|---|
| 2010/0277449 A1* | 11/2010 | Kanda | ................ | H01L 27/3276 |
| | | | | 345/206 |
| 2015/0311224 A1* | 10/2015 | Zhang | ................ | H01L 27/1262 |
| | | | | 257/72 |
| 2016/0204186 A1* | 7/2016 | Han | ................ | H01L 27/3279 |
| | | | | 257/40 |
| 2017/0194593 A1* | 7/2017 | Ma | ................ | H01L 27/3279 |
| 2018/0314122 A1* | 11/2018 | Saitoh | ................ | H01L 27/1218 |

FOREIGN PATENT DOCUMENTS

| KR | 10-0741973 B1 | 7/2007 |
|---|---|---|
| KR | 10-1182233 B1 | 9/2012 |
| KR | 10-2017-0143066 A | 12/2017 |
| KR | 10-2018-0004488 A | 1/2018 |
| KR | 10-2018-0066948 A | 6/2018 |

* cited by examiner

FIG. 6
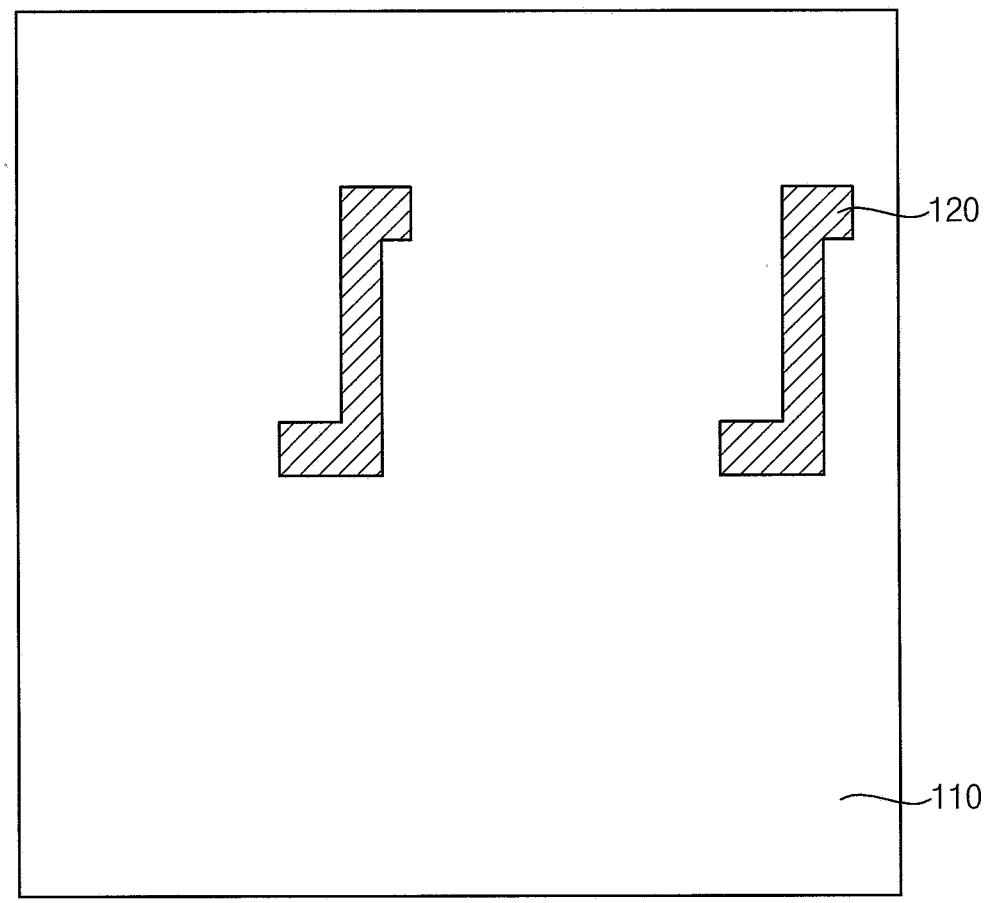
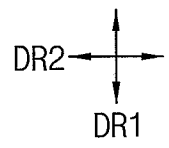

FIG. 8
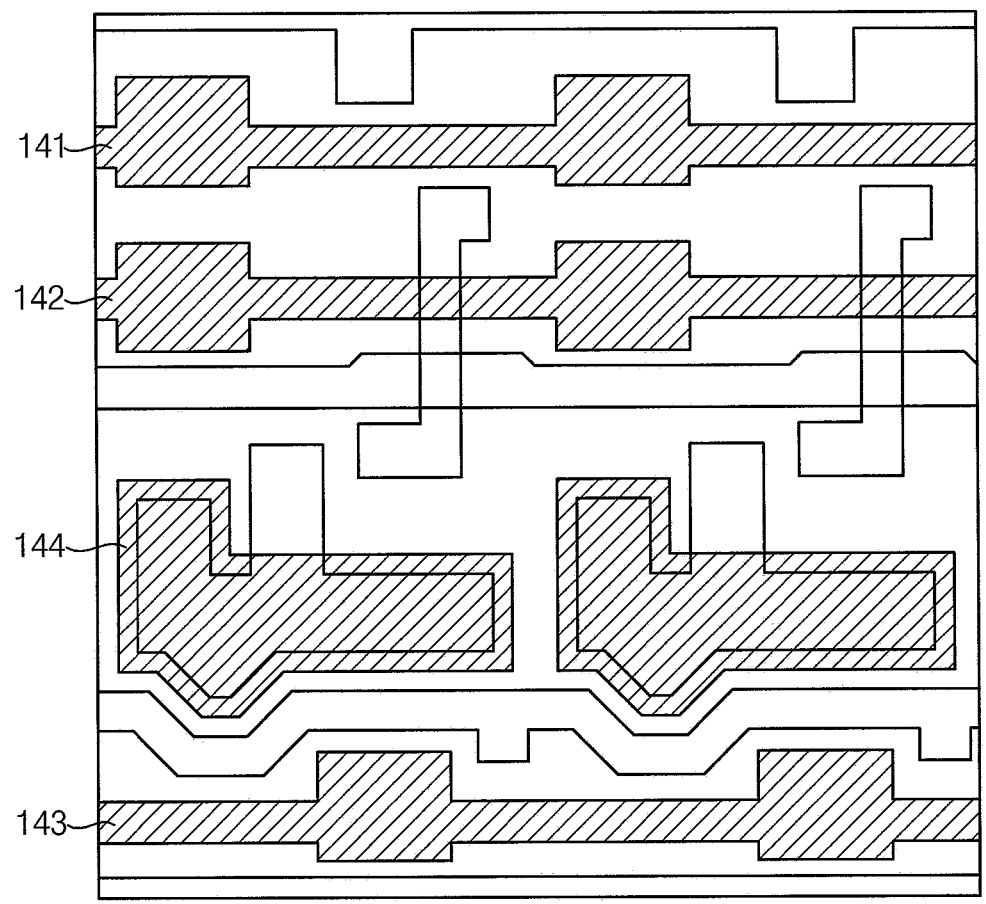
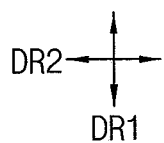

DISPLAY DEVICE HAVING PERIPHERAL COMMON VOLTAGE LINE

CROSS-REFERENCE TO RELATED APPLICATION

This application claims priority to and the benefit of Korean Patent Application No. 10-2019-0043646 filed on Apr. 15, 2019 in the Korean Intellectual Property Office (KIPO), the entire disclosure of which is incorporated by reference herein.

BACKGROUND

1. Field

Embodiments relate to a display device.

2. Description of the Related Art

Recently, flat panel display devices such as a liquid crystal display device, an organic light emitting display device, etc., have been widely used. The organic light emitting display device is a self-luminous display device, and unlike the liquid crystal display device, the organic light emitting display device does not require separate light sources, and thus, thickness and weight may be reduced relative to other display devices. Moreover, organic light emitting display devices exhibit relatively high quality characteristics such as low power consumption, high luminance, fast response speeds, and the like, and thus are being highlighted as a next generation display device.

A display device may include a plurality of pixels each including a light emitting element that includes a pixel electrode, a common electrode, and an emission layer. The display device may further include a driving voltage line for providing a driving voltage to the pixels and a common voltage line for providing a common voltage to the pixels.

The common electrode of the light emitting element may have a relatively small thickness, therefore, a voltage drop of the common voltage provided to the common electrode of the light emitting element may occur. When the voltage drop of the common voltage occurs, luminance uniformity between the pixels may be decreased.

The above information disclosed in this Background section is only for enhancement of understanding of the background and therefore the information discussed in this Background section does not necessarily constitute prior art.

SUMMARY

Aspects of some example embodiments include a display device in which a voltage drop of a common voltage may be minimized or reduced and luminance uniformity may be improved.

A display device according to some example embodiments includes: a substrate including a display area at which a pixel including a light emitting element is located and a peripheral area surrounding the display area, and a common voltage line on the substrate, the common voltage line providing a common voltage to the pixel. The common voltage line may include a peripheral common voltage line on the peripheral area of the substrate to surround the display area and connected to a common electrode of the light emitting element, and a plurality of display common voltage lines crossing the display area and each contacting different portions of the peripheral common voltage line, the display common voltage lines being spaced apart from the common electrode of the light emitting element.

According to some example embodiments, the display common voltage lines may include a plurality of first display common voltage lines extending along a first direction and each contacting facing portions of the peripheral common voltage line with respect to the display area.

According to some example embodiments, the display device may further include a data line crossing the display area along the first direction and providing a data signal to the pixel. The first display common voltage lines may be on substantially the same layer as that of the data line.

According to some example embodiments, the display device may further include a reference voltage line crossing the display area along the first direction and providing a reference voltage to the pixel. The first display common voltage lines may be on substantially the same layer as that of the reference voltage line.

According to some example embodiments, the display common voltage lines may further include a plurality of second display common voltage lines extending along a second direction crossing the first direction and each contacting facing portions of the peripheral common voltage line with respect to the display area.

According to some example embodiments, the second display common voltage lines may be on a different layer from that of the first display common voltage lines, and each of the second display common voltage lines may be connected to the first display common voltage lines through a contact hole.

According to some example embodiments, the second display common voltage lines may be on substantially the same layer as that of an electrode of a capacitor included in the pixel.

According to some example embodiments, the peripheral common voltage line may have a closed shape substantially surrounding the display area.

According to some example embodiments, the display device may further include a peripheral conductive layer in the peripheral area between the peripheral common voltage line and the common electrode of the light emitting element to surround the display area. The peripheral common voltage line may be connected to the common electrode of the light emitting element through the peripheral conductive layer.

According to some example embodiments, the peripheral conductive layer may be on substantially the same layer as that of a pixel electrode of the light emitting element.

According to some example embodiments, the pixel may include a first transistor providing a driving current to the light emitting element, and the first transistor may be an n-type transistor.

According to some example embodiments, the first transistor may include an oxide semiconductor.

According to some example embodiments, the pixel may further include a second transistor providing a data signal to the first transistor, a third transistor providing a reference voltage to the first transistor, and a fourth transistor providing an initialization voltage to the light emitting element. The second transistor, the third transistor, and the fourth transistor may be n-type transistors.

According to some example embodiments, the second transistor, the third transistor, and the fourth transistor may include an oxide semiconductor.

According to some example embodiments, the pixel may further include a fifth transistor providing a driving voltage to the light emitting element, and the fifth transistor may be a p-type transistor.

According to some example embodiments, the fifth transistor may include polycrystalline silicon.

According to some example embodiments, the display device may further include a driving voltage line providing a driving voltage to the pixel. The driving voltage line may include a peripheral driving voltage line on the peripheral area of the substrate to correspond to a side of the display area, and a plurality of display driving voltage lines crossing the display area, the display driving voltage lines being connected to the peripheral driving voltage line and connected to a pixel electrode of the light emitting element.

According to some example embodiments, the display driving voltage lines may be on a different layer from the display common voltage lines.

According to some example embodiments, the display driving voltage lines may include a plurality of first display driving voltage lines extending along a first direction and connected to the peripheral driving voltage line.

According to some example embodiments, the display driving voltage lines may further include a plurality of second display driving voltage lines extending along a second direction crossing the first direction and respectively connected to the first display driving voltage lines.

The common voltage line of the display device according to some example embodiments may include the peripheral common voltage line and the plurality of display common voltage lines crossing the display area, each contacting different portions of the peripheral common voltage line, and being spaced apart from (or not directly contacting) the common electrode of the light emitting element. Accordingly, the voltage drop of the common voltage may be minimized or reduced, and the luminance uniformity of the display device may be improved.

BRIEF DESCRIPTION OF THE DRAWINGS

Illustrative, non-limiting embodiments will be more clearly understood from the following detailed description taken in conjunction with the accompanying drawings.

FIGS. 6, 7, 8, 9, 10, 11, and 12 are layout diagrams illustrating an example of realizing the pixel in FIG. 4.

DETAILED DESCRIPTION

Hereinafter, aspects of display devices according to some example embodiments will be explained in more detail with reference to the accompanying drawings.

Figure 1:
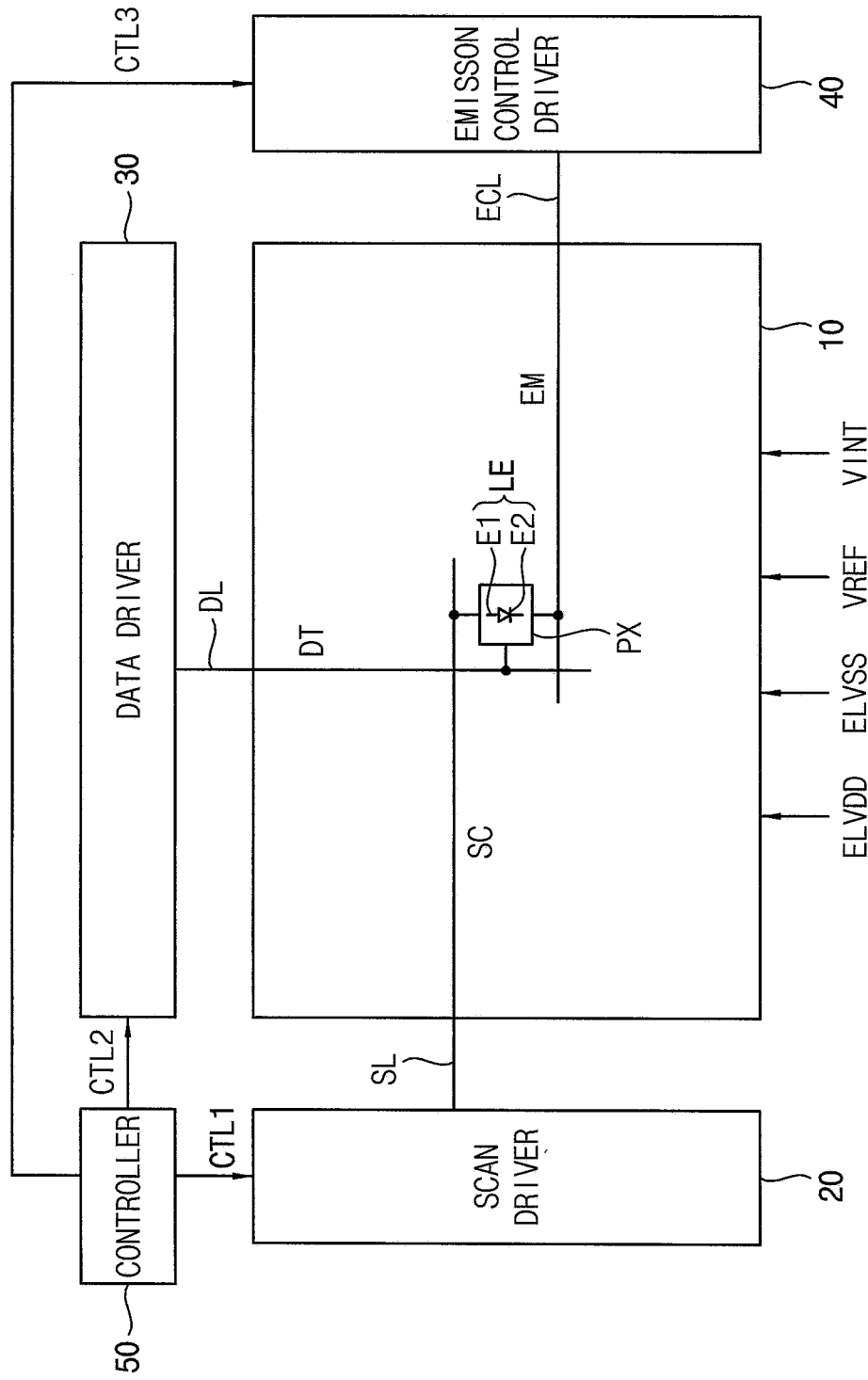
FIG. 1 is a block diagram illustrating a display device according to some example embodiments.

FIG. 1 is a block diagram illustrating a display device according to some example embodiments.

Referring to FIG. 1, a display device may include a display unit 10, a scan driver 20, a data driver 30, an emission control driver 40, and a controller 50.

The display unit 10 may include a plurality of pixels PX for displaying an image. For example, the pixels PX may be located at intersections between scan lines SL, data lines DL, and emission control lines ECL, and may be arranged in a substantial matrix form. Each of the pixels PX may include a light emitting element LE. The light emitting element LE may include a pixel electrode E1 and a common electrode E2. Each of the pixels PX may further include a plurality of transistors. According to some example embodiments, some of the transistors may be realized as an n-type transistor including an oxide semiconductor, and others of the transistors may be realized as a p-type transistor including polycrystalline silicon. The pixels PX may be formed of first and second semiconductor layers and first to fifth conductive layers. For example, the p-type transistor may be formed of the first semiconductor layer and the first conductive layer, and the n-type transistor may be formed of the second semiconductor layer, the second conductive layer, and the third conductive layer. The pixel PX will be described in more detail with reference to FIGS. 4 to 12 below.

The scan driver 20 may sequentially provide scan signals SC to the pixels PX through the scan lines SL based on a first control signal CTL1. According to some example embodiments, the scan signals SC may include a first gate signal, a second gate signal, and a third gate signal.

The data driver 30 may provide data signals DT to the pixels PX through the data lines DL based on a second control signal CTL2.

The emission control driver 40 may sequentially provide emission control signals EM to the pixels PX through the emission control lines ECL based on a third control signal CTL3.

The controller 50 may control the scan driver 20, the data driver 30, and the emission control driver 40. The controller 50 may generate the first to third control signals CTL1, CTL2, and CTL3 to control the scan driver 20, the data driver 30, and the emission control driver 40, respectively. The first control signal CTL1 for controlling the scan driver 20 may include a scan start signal, scan clock signals, etc. The second control signal CTL2 for the controlling the data driver 30 may include digital image data, a horizontal start signal, etc. The third control signal CTL3 for the controlling the emission control driver 40 may include an emission control start signal, emission control clock signals, etc.

The display device may further include a power supply providing a driving voltage ELVDD, a common voltage ELVSS, a reference voltage VREF, and an initialization voltage VINT to the display unit 10. The driving voltage ELVDD may be provided to the display unit 10 through a driving voltage line, and the common voltage ELVSS may be provided to the display unit 10 through a common voltage line. For example, the driving voltage ELVDD may be provided to the pixel electrode E1 of the light emitting element LE included in the pixel PX, and the common voltage ELVSS may be provided to the common electrode E2 of the light emitting element LE included in the pixel PX.

Figure 2:
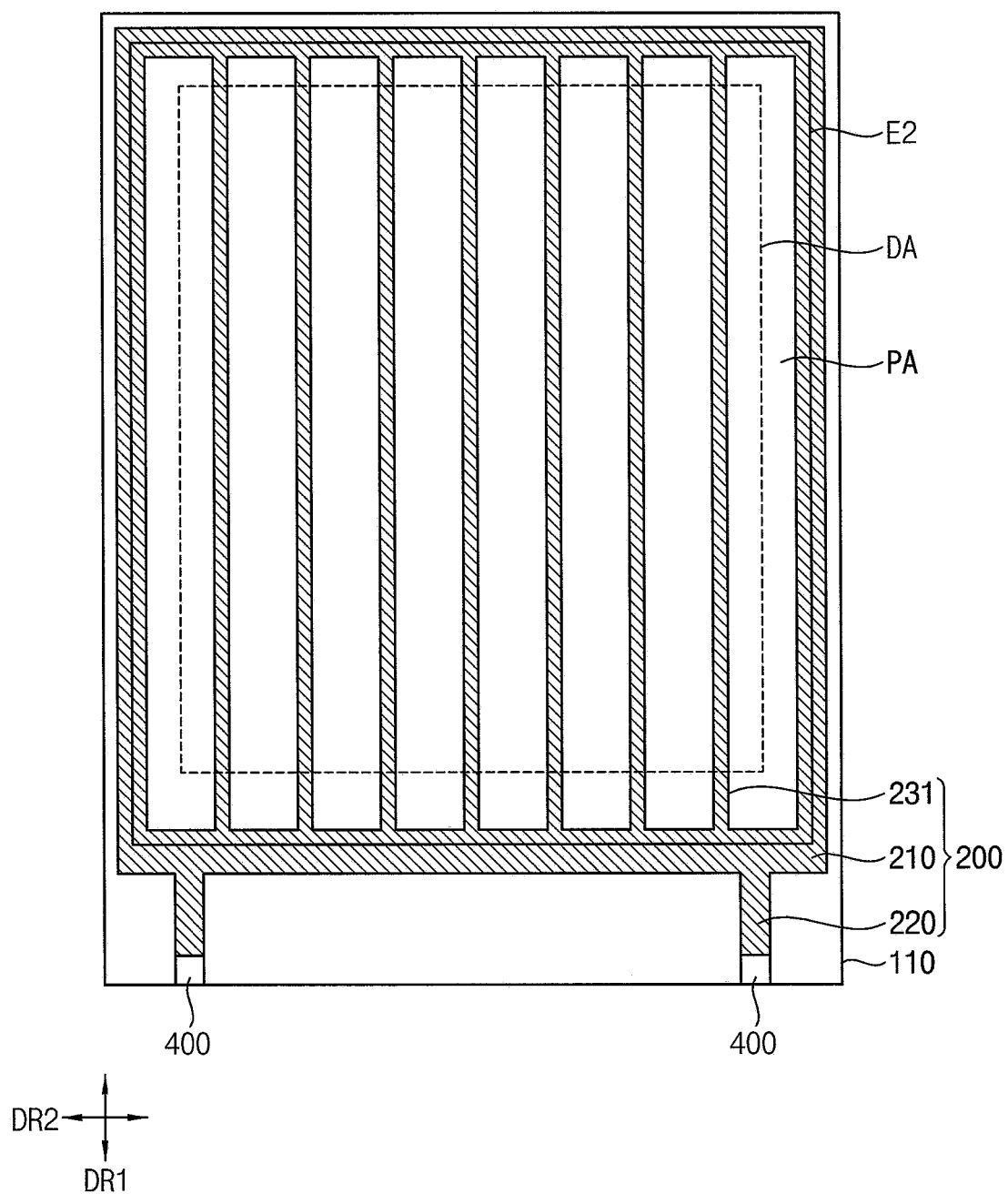
FIG. 2 is a plan view illustrating an example of a common voltage line included in the display device in FIG. 1.
Figure 3:
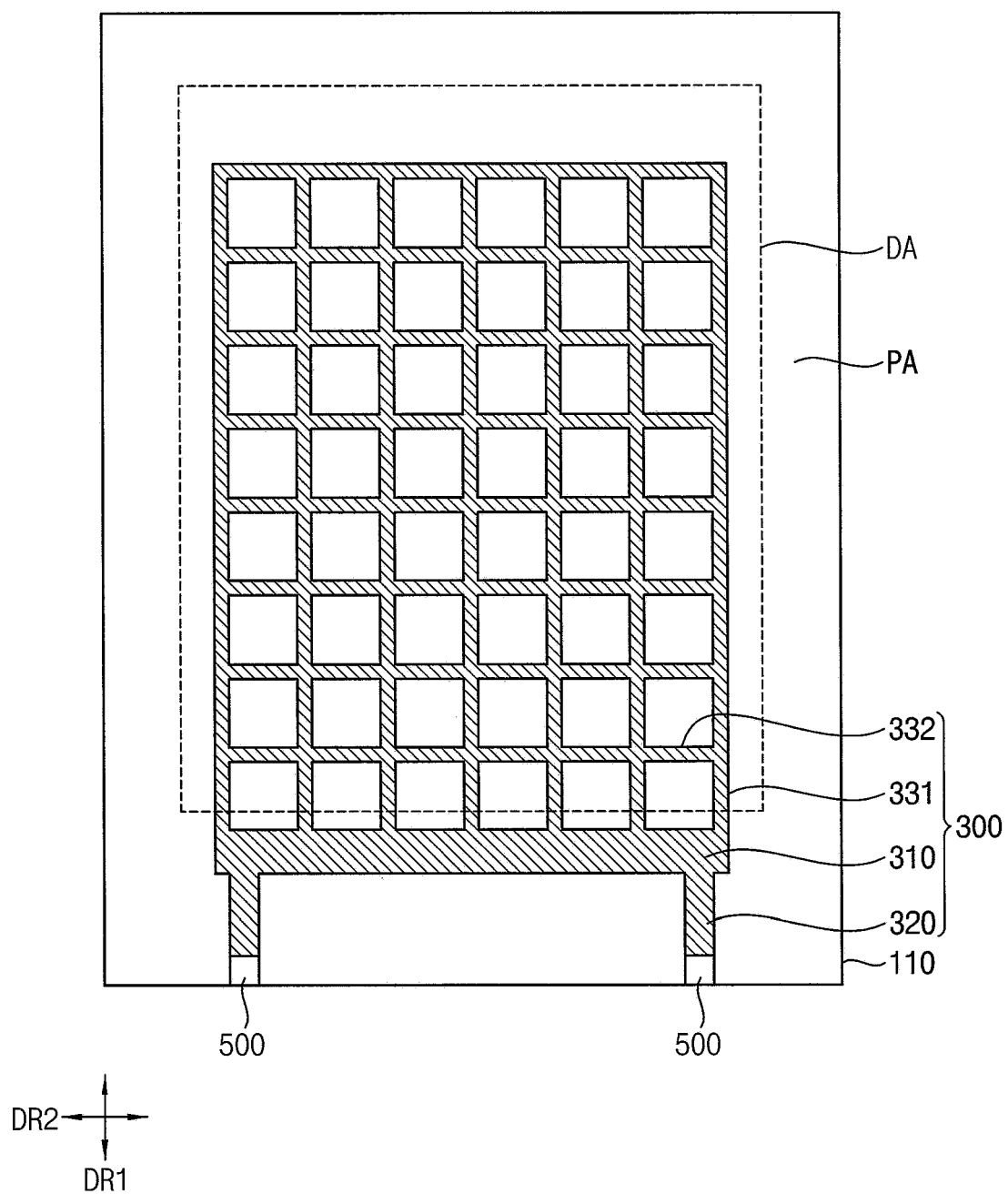
FIG. 3 is a plan view illustrating an example of a driving voltage line included in the display device in FIG. 1.

FIG. 2 is a plan view illustrating an example of the common voltage line included in the display device in FIG. 1. FIG. 3 is a plan view illustrating an example of the driving voltage line included in the display device in FIG. 1.

Referring to FIGS. 1, 2, and 3, the display device may include a substrate 110, the common voltage line 200, and the driving voltage line 300.

The substrate 110 may include a display area DA and a peripheral area PA. The display unit 10 may be located on the display area DA of the substrate 110, therefore, the pixels PX may be located in the display area DA. An image may be displayed from the display area DA by the pixels PX that emit light. The peripheral area PA may be located outside the display area DA. For example, the peripheral area PA may surround the display area DA. According to some example embodiments, the scan driver 20, the data driver 30, the emission control driver 40 may be located on the peripheral area PA of the substrate 110. The pixels PX may not be located on the peripheral area PA, therefore, the peripheral area PA may be a non-display area.

As illustrated in FIG. 2, the common voltage line 200 may be located on the substrate 110, and may provide the common voltage ELVSS to the pixels PX. The common voltage line 200 may include a peripheral common voltage line 210, a connecting common voltage line 220, and a plurality of display common voltage lines. According to some example embodiments, the plurality of display common voltage lines may include a plurality of first display common voltage lines 231.

The peripheral common voltage line 210 may be located on the peripheral area PA of the substrate 110 to surround the display area DA. According to some example embodiments, the peripheral common voltage line 210 may have a closed shape substantially surrounding the display area DA. For example, when the display area DA has a rectangular shape in a plan view, the peripheral common voltage line 210 may extend along four sides of the display area DA. In such example, the peripheral common voltage line 210 may have a quadrangular frame shape including an upper side, a lower side, a left side, and a right side in a plan view.

The peripheral common voltage line 210 may be connected to the common electrode E2 of the light emitting element LE included in pixel PX. According to some example embodiments, a peripheral conductive layer may be formed in the peripheral area PA between the peripheral common voltage line 210 and the common electrode E2 of the light emitting element LE. The peripheral conductive layer may be located to surround the display area DA. The peripheral common voltage line 210 may be connected to the common electrode E2 of the light emitting element LE through the peripheral conductive layer. For example, the peripheral conductive layer may be located on substantially the same layer as that of the pixel electrode E1 of the light emitting element LE. Since the peripheral common voltage line 210 is connected to the common electrode E2 of the light emitting element LE in the peripheral area PA, the common voltage line 200 may provide the common voltage ELVSS to the pixels PX.

The connecting common voltage line 220 may extend along the first direction DR1 from the peripheral common voltage line 210. The connecting common voltage line 220 may be connected to a common voltage pad 400. The common voltage pad 400 may provide the common voltage ELVSS to the connecting common voltage line 220.

The first display common voltage lines 231 may cross the display area DA. Each of the first display common voltage lines 231 may contact different portions of the peripheral common voltage line 210. According to some example embodiments, the first display common voltage lines 231 may extend along the first direction DR1, and each of the first display common voltage lines 231 may contact facing portions of the peripheral common voltage line 210 with respect to the display area DA. For example, each of the first display common voltage lines 231 may contact the upper side and the lower side of the peripheral common voltage line 210.

According to some example embodiments, the first display common voltage lines 231 may be spaced apart from (or not directly contact) the common electrode E2 of the light emitting element LE. As mentioned above, since the peripheral common voltage line 210 is connected to the common electrode E2 of the light emitting element LE in the peripheral area PA, although the first display common voltage lines 231 are spaced apart from (or do not directly contact) the common electrode E2 of the light emitting element LE, the common voltage ELVSS may be provided to the common electrode E2 of the light emitting element LE.

An electric current generated in the common electrode E2 of the light emitting element LE inside the display area DA may be moved to the common electrode E2 inside the peripheral area PA, and the electric current may flow from the upper side to the lower side of the peripheral common voltage line 210 along the first display common voltage line 231 crossing the display area DA. Accordingly, a voltage drop of the common voltage ELVSS may be minimized or reduced. Further, luminance uniformity of the display device may be improved by minimizing or reducing the voltage drop of the common voltage ELVSS.

As illustrated in FIG. 3, the driving voltage line 300 may be located on the substrate 110, and may provide the driving voltage ELVDD to the pixels PX. The driving voltage line 300 may include a peripheral driving voltage line 310, a connecting driving voltage line 320, and a plurality of display driving voltage lines. According to some example embodiments, the plurality of display driving voltage lines may include a plurality of first display driving voltage lines 331 and a plurality of second display driving voltage lines 332.

The peripheral driving voltage line 310 may be located on the peripheral area PA of the substrate 110 to correspond to a side of the display area DA. For example, when the display area DA has a rectangular shape in a plan view, the peripheral driving voltage line 310 may be located to correspond to any one side of the display area DA. In such example, the any one side corresponding to the peripheral driving voltage line 310 may be a side of the display area DA adjacent to a driving voltage pad 500.

The connecting driving voltage line 320 may extend along the first direction DR1 from the peripheral driving voltage line 310. The connecting driving voltage line 320 may be connected to the driving voltage pad 500. The driving voltage pad 500 may provide the driving voltage ELVDD to the connecting driving voltage line 320.

The first display driving voltage lines 331 may cross the display area DA, and may be connected to the peripheral driving voltage line 310. According to some example embodiments, the first display driving voltage lines 331 may extend along the first direction DR1. The first display driving voltage line 331 may be connected to the pixel electrode E1 of the light emitting element LE. For example, the first display driving voltage line 331 may be connected to the pixel electrode E1 of the light emitting element LE of each of the pixels PX included in any one pixel column.

The second display driving voltage lines 332 may cross the display area DA, and each of the second display driving voltage lines 332 may be connected to the first display driving voltage lines 331. According to some example embodiments, the second display driving voltage lines 332 may extend along a second direction DR2 crossing the first direction DR1. The second display driving voltage line 332 may be connected to the pixel electrode E1 of the light emitting element LE. For example, the second display driving voltage line 332 may be connected to the pixel electrode E1 of the light emitting element LE of each of the pixels PX included in any one pixel row.

According to some example embodiments, the second display driving voltage lines 332 may be located on a different layer from that of the first display driving voltage lines 331 inside the display area DA. Each of the second display driving voltage lines 332 may be connected to the first display driving voltage lines 331 that are located on a different layer through a contact hole.

The first display driving voltage lines 331 and the second display driving voltage lines 332 may be located on different layers from that of the first display common voltage lines 231 inside the display area DA. Accordingly, the first and second display driving voltage lines 331 and 332 may be insulated from the first display common voltage lines 231.

Hereinafter, a structure of the pixel according to some example embodiments will be described in more detail with reference to FIGS. 4 to 12.

Figure 4:
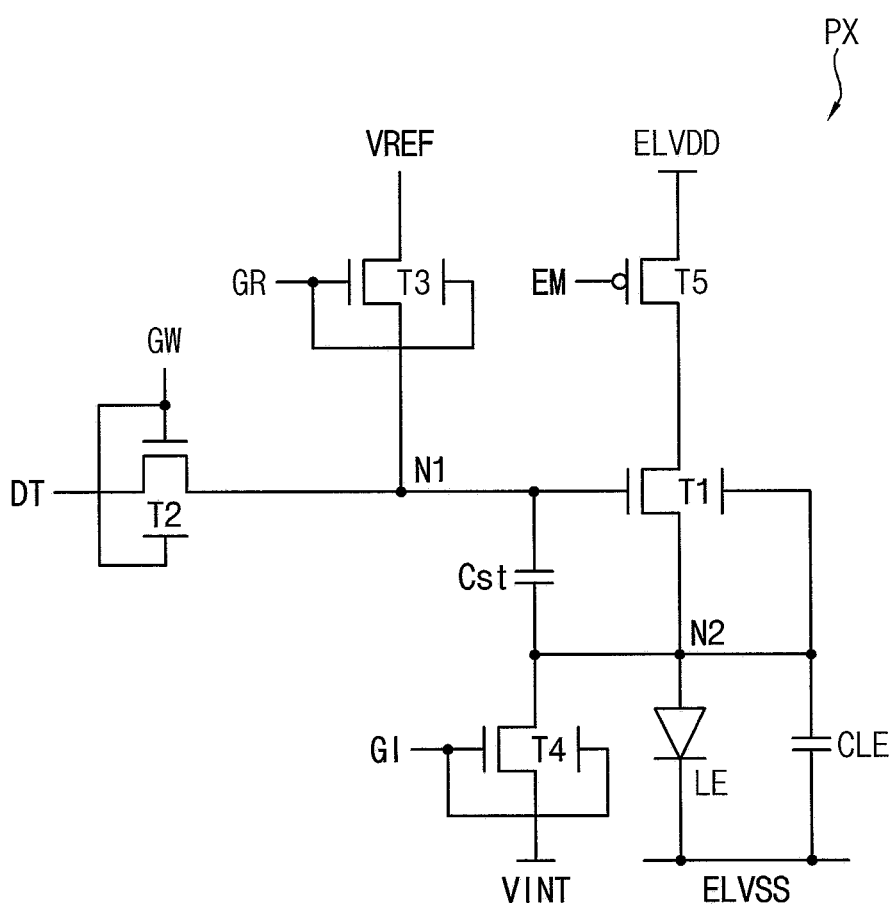
FIG. 4 is a circuit diagram illustrating an example of a pixel included in the display device in FIG. 1.

FIG. 4 is a circuit diagram illustrating an example of the pixel PX included in the display device in FIG. 1.

Referring to FIG. 4, the pixel PX may include a plurality of transistors T1, T2, T3, T4, and T5, a storage capacitor Cst, and the light emitting element LE. The transistors T1, T2, T3, T4, and T5 may include a first transistor T1, a second transistor T2, a third transistor T3, a fourth transistor T4, and a fifth transistor T5.

The first transistor T1 may be a driving transistor providing driving current corresponding to the data signal DT to the light emitting element LE. According to some example embodiments, the first transistor T1 may be an n-type double gate transistor including an oxide semiconductor. For example, the first transistor T1 may have a first gate electrode connected to a first node N1, a first electrode connected to a second node N2, a second electrode connected to the fifth transistor T5, and a second gate electrode connected to the first electrode.

The second transistor T2 may be a switching transistor providing the data signal DT to the first transistor T1 in response to the first gate signal GW. According to some example embodiments, the second transistor T2 may be an n-type double gate transistor including an oxide semiconductor. For example, the second transistor T2 may have a first gate electrode receiving the first gate signal GW, a first electrode connected to the first node N1, a second electrode receiving the data signal DT, and a second gate electrode connected to the first gate electrode.

The third transistor T3 may be a reference voltage transistor providing the reference voltage VREF to the first transistor T1 in response to the second gate signal GR. According to some example embodiments, the third transistor T3 may be an n-type double gate transistor including an oxide semiconductor. For example, the third transistor T3 may have a first gate electrode receiving the second gate signal GR, a first electrode connected to the first node N1, a second electrode receiving the reference voltage VREF, and a second gate electrode connected to the first gate electrode.

The fourth transistor T4 may be an initialization transistor providing the initialization voltage VINT to the light emitting element LE in response to the third gate signal GI. According to some example embodiments, the fourth transistor T4 may be an n-type double gate transistor including an oxide semiconductor. For example, the fourth transistor T4 may have a first gate electrode receiving the third gate signal GI, a first electrode connected to the second node N2, a second electrode receiving the initialization voltage VINT, and a second gate electrode connected to the first gate electrode.

The fifth transistor T5 may be an emission control transistor providing the driving voltage ELVDD to the light emitting element LE in response to the emission control signal EM. According to some example embodiments, the fifth transistor T5 may be a p-type transistor including polycrystalline silicon. For example, the fifth transistor T5 may have a gate electrode receiving the emission control signal EM, a first electrode receiving the driving voltage ELVDD, and a second electrode connected to the second electrode of the first transistor T1.

The storage capacitor Cst may store a voltage corresponding to the data signal DT and a threshold voltage of the first transistor T1. The storage capacitor Cst may include a first capacitor electrode connected to the first node N1 and a second capacitor electrode connected to the second node N2.

The light emitting element LE may emit light based on the driving current provided from the first transistor T1. The light emitting element LE may include a first electrode connected to the second node N2 and receiving the driving voltage ELVDD through the first transistor T1 and the fifth transistor T5, a second electrode receiving the common voltage ELVSS, and an emission layer located between the first electrode and the second electrode.

The emission layer may include at least one of an organic light emitting material or a quantum dot material. According to some example embodiments, the organic light emitting material may include a low molecular weight polymer or a high molecular weight polymer. For example, the low molecular weight polymer may include copper phthalocyanine, N,N'-diphenylbenzidine, tris-(8-hydroxyquinoline)aluminum, etc., and the high molecular weight polymer may include poly(3,4-ethylenedioxythiophene), polyaniline, poly-phenylenevinylene, polyfluorene, etc.

According to some example embodiments, the quantum dot material may include a core that includes a group II-VI compound, a group III-V compound, a group IV-VI compound, a group IV element, a group IV compound, and a combination thereof. For example, the group II-VI compound may include CdSe, CdTe, ZnS, ZnSe, ZnTe, ZnO, HgS, HgSe, HgTe, MgSe, MgS, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, HgZnTeS, CdZnSeS, CdZnSeTe, CdZnSTe, CdHgSeS, CdHgSeTe, CdHgSTe, HgZnSeS, HgZnSeTe, HgZnSTe, etc., and the group III-V compound may include GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, etc.

For example, the group IV-VI compound may include SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, etc., the group IV element may include Si, Ge, etc., and the group IV compound may include SiC, SiGe, etc.

According to some example embodiments, the quantum dot material may have a core-shell structure that includes the core and a shell surrounding the core. The shell may serve as a protective layer for preventing chemical degeneration of the core to maintain semiconductor property of the core and a charging layer for imparting electrophoretic property to the quantum dot material.

The shell may include, for example, a metallic or non-metallic oxide material, a semiconductor compound, and a combination thereof. For example, the metallic or nonmetallic oxide material may include $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, $MgAl_2O_4$, $CoFe_2O_4$, $NiFe_2O_4$, $CoMn_2O_4$, etc., and the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc.

According to some example embodiments, the emission layer may emit different colors of light. For example, the emission layer may emit red light, green light, and blue light. According to some example embodiments, the emission layer may emit one color of light. For example, the emission layer may emit blue light. In such an embodiment, a color conversion element that converts color of light emitted from the light emitting element LE or transmits the light may be located over the light emitting element LE. The color conversion element may include a material (e.g., quantum dot, etc.) for converting color of light. For example, the color conversion element may convert blue light into the red light or green light or may transmit the blue light.

Figure 5:
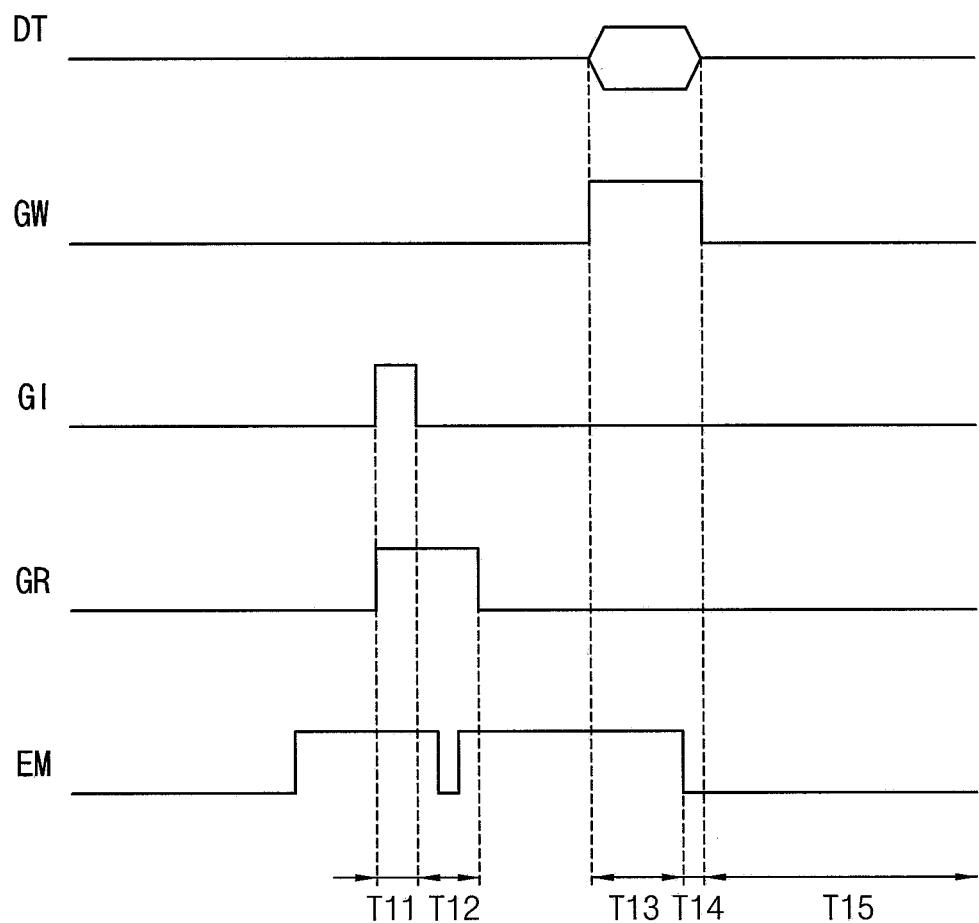
FIG. 5 is a waveform diagram illustrating an example of a method of driving the pixel in FIG. 4.

FIG. 5 is a waveform diagram illustrating an example of a method of driving the pixel PX in FIG. 4.

Referring to FIGS. 4 and 5, the emission control signal EM having a high-level voltage may be provided to turn off the fifth transistor T5. When the fifth transistor T5 is turned off, the driving voltage ELVDD may not be provided to the first transistor T1. Therefore, the light emitting element LE may not emit light during a period in which the emission control signal EM having the high-level voltage is provided.

During a first period T11, the third gate signal GI having a high-level voltage and the second gate signal GR having a high-level voltage may be provided. When the third gate signal GI having the high-level voltage is provided, the fourth transistor T4 that is an n-type transistor may be turned on. When the fourth transistor T4 is turned on, the initialization voltage VINT may be provided to the second node N2. In this case, a parasitic capacitor CLE of the light emitting element LE may be discharged. The initialization voltage VINT may be less than a voltage obtained by adding a threshold voltage of the light emitting element LE to the common voltage ELVSS.

When the second gate signal GR having the high-level voltage is provided, the third transistor T3 that is an n-type transistor may be turned on. When the third transistor T3 is turned on, the reference voltage VREF may be provided to the first node N1. The reference voltage VREF may be set to a voltage to turn on the first transistor T1. According to some example embodiments, a voltage (VREF-VINT) obtained by subtracting the initialization voltage VINT from the reference voltage VREF may be greater than the threshold voltage of the first transistor T1.

During a second period T12, the third gate signal GI having a low-level voltage may be provided to turn off the fourth transistor T4. In addition, during part of the second period T12, the emission control signal EM having a low-level voltage may be provided.

When the emission control signal EM having the low-level voltage is provided, the fifth transistor T5 may be turned on. When the fifth transistor T5 is turned on, the driving voltage ELVDD may be provided to the first electrode of the first transistor T1. When the driving voltage ELVDD is provided to the first electrode of the first transistor T1, a voltage of the second node N2 may be increased. The first node N1 may maintain the reference voltage VREF during the second period T12. Therefore, the voltage of the second node N2 may be increased to a voltage obtained by subtracting the threshold voltage of the first transistor T1 from the reference voltage VREF. In this case, the storage capacitor Cst may store the threshold voltage of the first transistor T1.

The second gate signal GR having a low-level voltage may be provided after the second period T12. The third transistor T3 may be turned off when the second gate signal GR having the low-level voltage is provided.

The first gate signal GW having a high-level voltage and the data signal DT may be provided during a third period T13. The second transistor T2 that is an n-type transistor may be turned on when the first gate signal GW having the high-level voltage is provided. The data signal DT may be provided to the first node N1 when the second transistor T2 is turned on. The data signal DT provided to the first node N1 may be stored in the storage capacitor Cst. For example, a voltage corresponding to the data signal DT and the threshold voltage of the first transistor T1 may be stored in the storage capacitor Cst during the second period T12 and the third period T13.

The emission control signal EM having the low-level voltage may be provided during a fourth period T14. The first gate signal GW having the high-level voltage may be provided during the fourth period T14. The second transistor T2 may maintain a turned-on state during the fourth period T14, therefore, the first node N1 may maintain the voltage of the data signal DT. The fifth transistor T5 may be turned on when the emission control signal EM having the low-level voltage is provided.

The driving voltage ELVDD may be provided to the first transistor T1 when the fifth transistor T5 is turned on. A predetermined current may flow through the second node N2 when the first transistor T1 is turned on. A voltage corresponding to current flowing from the first transistor T1 may be stored in capacitance (C=Cst+CLE) by coupling the storage capacitor Cst and the parasitic capacitor CLE, in order to increase the voltage of the second node N2. Increasing the voltage of the second node N2 may correspond to mobility of the first transistor T1, and may differ between the pixels PX. As a result, the mobility of the first transistor T1 may be compensated. The time allocated to the fourth period T14 may be experimentally determined to compensate the mobility of the first transistor T1 included in each of the pixels PX.

The first gate signal GW having a low-level voltage may be provided during a fifth period T15 to turn off the second transistor T2. The first transistor T1 may control the amount of current flowing from the driving voltage ELVDD to the common voltage ELVSS through the light emitting element LE based on the voltage of the first node N1 during the fifth period T15. Thus, the light emitting element LE may generate light with predetermined brightness based on the amount of current.

FIGS. 6, 7, 8, 9, 10, 11, and 12 are layout diagrams illustrating an example of realizing the pixel PX in FIG. 4.

Referring to FIGS. 6 to 12, a first semiconductor layer 120, a first conductive layer 131, 132, 133, and 332, a second conductive layer 141, 142, 143, and 144, a second semiconductor layer 151 and 152, a third conductive layer 161, 162, 163, and 164, a fourth conductive layer 171, 331, 173, 174, 175, 176, and 177, and a fifth conductive layer 181, 231, and 183 may be sequentially located on the substrate 110. The first semiconductor layer 120, the first conductive layer 131, 132, 133, and 332, the second conductive layer 141, 142, 143, and 144, the second semiconductor layer 151 and 152, the third conductive layer 161, 162, 163, and 164, the fourth conductive layer 171, 331, 173, 174, 175, 176, and 177, and the fifth conductive layer 181, 231, and 183 may form the first to fifth transistors T1, T2, T3, T4, and T5 and the storage capacitor Cst on the substrate 110.

The substrate 110 may include a transparent and insulating substrate. For example, the substrate 110 may be formed of a glass substrate, a quartz substrate, a plastic substrate, or the like. According to some example embodiments, the substrate 110 may include a structure in which an organic insulation layer and an inorganic insulation layer are alternately positioned. For example, the substrate 110 may be formed of a structure in which a first organic insulation layer including polyimide (PI), a first inorganic insulation layer including silicon compounds and/or amorphous silicon, a second organic insulation layer including polyimide, and a second inorganic insulation layer including silicon compounds are sequentially stacked.

As illustrated in FIG. 6, the first semiconductor layer 120 may be located on the substrate 110. A buffer layer may be interposed between the substrate 110 and the first semiconductor layer 120 to insulate therebetween. The buffer layer may prevent impurities from being permeated from the substrate 110, and may control a transmission rate of heat in a crystallization process for forming the first semiconductor layer 120. The buffer layer may include silicon compounds, metal oxide, or the like.

The first semiconductor layer 120 may include a source region, a drain region, and a channel region of the fifth transistor T5.

According to some example embodiments, the first semiconductor layer 120 may be formed of polycrystalline silicon. For example, after an amorphous silicon layer is deposited on the buffer layer, the amorphous silicon layer may be crystallized to form the polycrystalline silicon layer. Then, the polycrystalline silicon layer may be patterned to form the first semiconductor layer 120.

Figure 7:
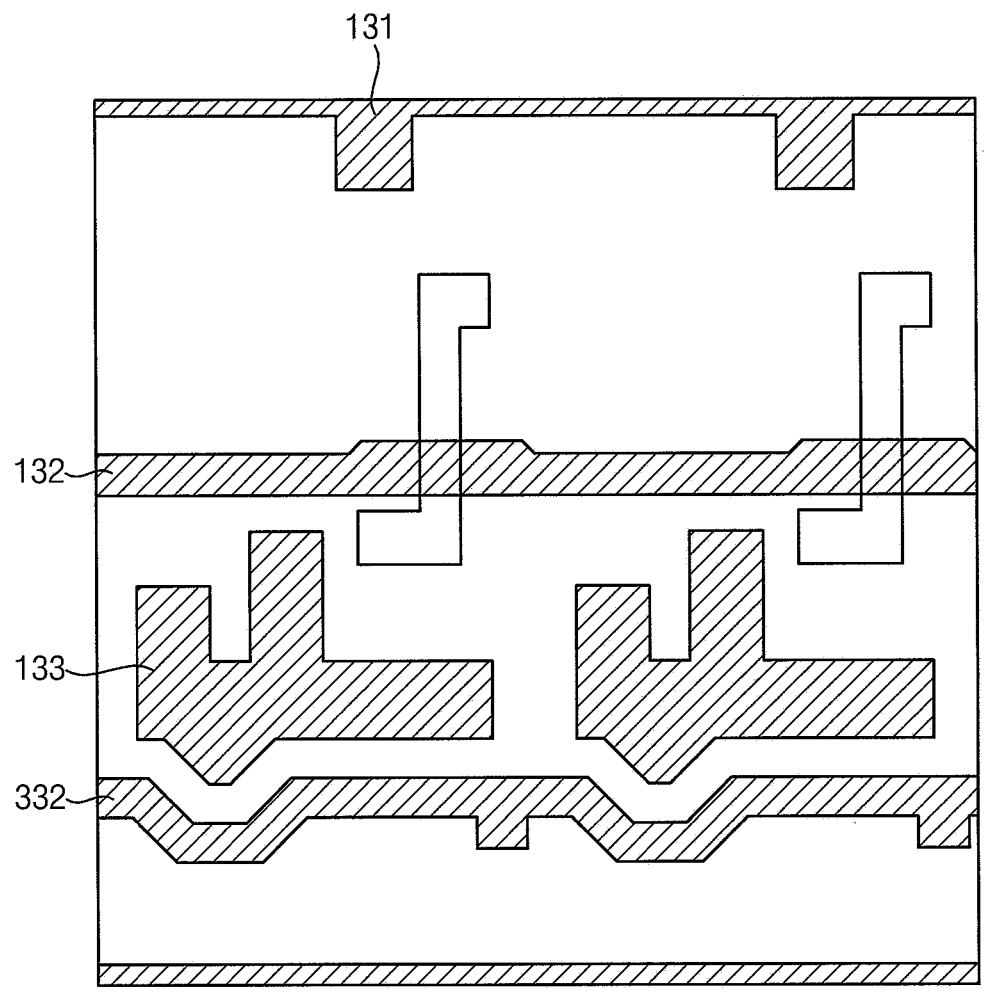

As illustrated in FIG. 7, the first conductive layer 131, 132, 133, and 332 may be located on the first semiconductor layer 120. A first insulation layer may be interposed between the first semiconductor layer 120 and the first conductive layer 131, 132, 133, and 332 to insulate therebetween. The first insulation layer may include silicon compounds, metal oxide, or the like.

The first conductive layer 131, 132, 133, and 332 may include an initialization voltage line 131, an emission control line 132, a first capacitor electrode 133, and the second display driving voltage line 332. The initialization voltage line 131, the emission control line 132, and the second display driving voltage line 332 may substantially extend along the second direction DR2. A portion of the emission control line 132 overlapping the first semiconductor layer 120 may function as the gate electrode of the fifth transistor T5. The first semiconductor layer 120 and the emission control line 132 may form the fifth transistor T5. The first conductive layer 131, 132, 133, and 332 may be formed of metal, alloy, metal nitride, conductive metal oxide, transparent conductive material, or the like.

As illustrated in FIG. 8, the second conductive layer 141, 142, 143, and 144 may be located on the first conductive layer 131, 132, 133, and 332. A second insulation layer may be interposed between the first conductive layer 131, 132, 133, and 332 and the second conductive layer 141, 142, 143, and 144 to insulate therebetween. The second insulation layer may include silicon compounds, metal oxide, or the like.

The second conductive layer 141, 142, 143, and 144 may include a first lower gate line 141, a second lower gate line 142, a third lower gate line 143, and the second capacitor electrode 144. The first lower gate line 141, the second lower gate line 142, and the third lower gate line 143 may substantially extend along the second direction DR2. The first capacitor electrode 133 and the second capacitor electrode 144 may form the storage capacitor Cst. The second conductive layer 141, 142, 143, and 144 may be formed of metal, alloy, metal nitride, conductive metal oxide, transparent conductive material, or the like.

Figure 9:
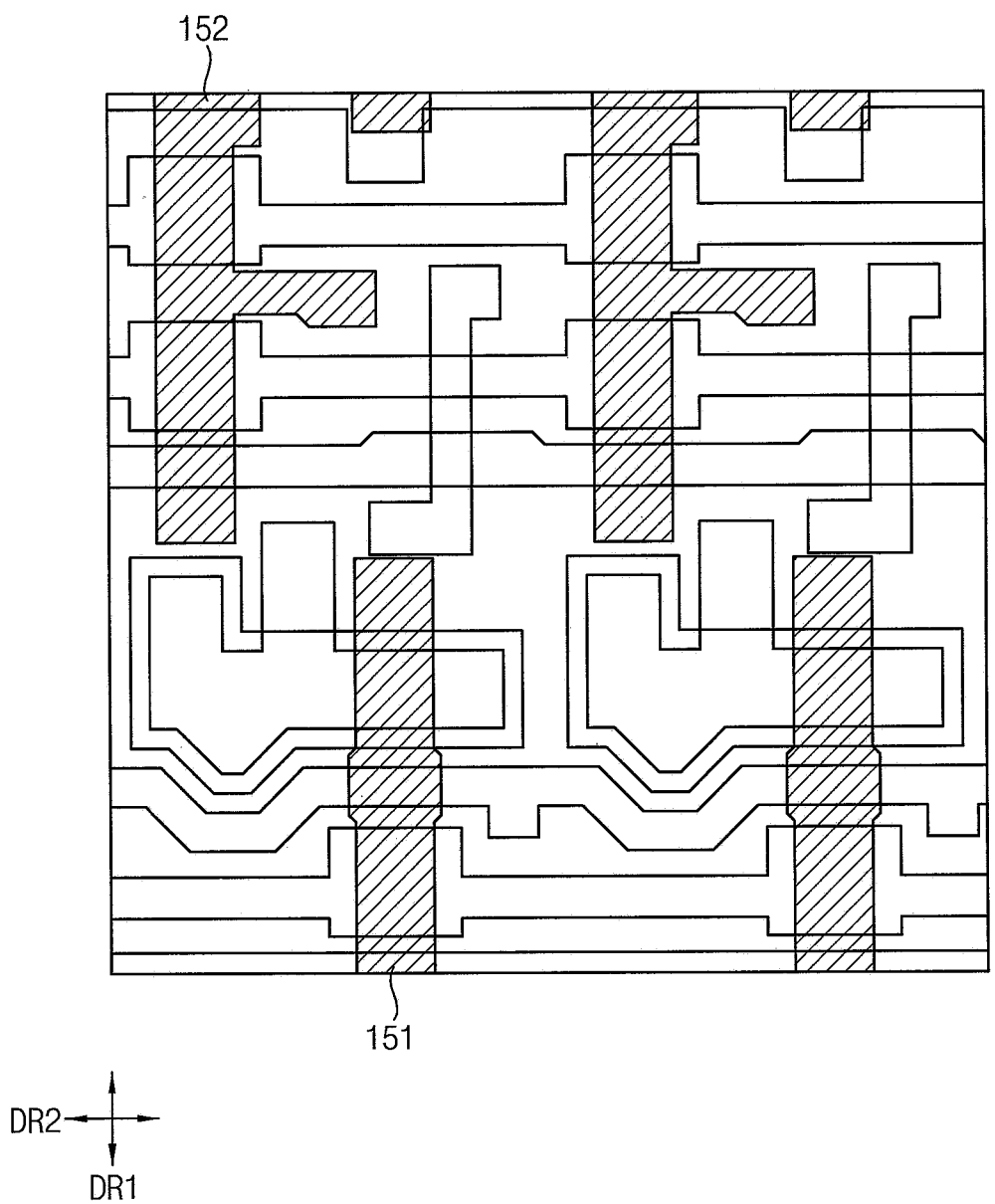

As illustrated in FIG. 9, the second semiconductor layer 151 and 152 may be located on the second conductive layer 141, 142, 143, and 144. A third insulation layer may be interposed between the second conductive layer 141, 142, 143, and 144 and the second semiconductor layer 151 and 152 to insulate therebetween. The third insulation layer may include silicon compounds, metal oxide, or the like.

The second semiconductor layer 151 and 152 may include a first semiconductor pattern 151 and a second semiconductor pattern 152. The first semiconductor pattern 151 may include a source region, a drain region, and a channel region of the first transistor T1 and a source region, a drain region, and a channel region of the fourth transistor T4. The second semiconductor pattern 152 may include a source region, a drain region, and a channel region of the second transistor T2 and a source region, a drain region, and a channel region of the third transistor T3.

A portion of the first capacitor electrode 133 overlapping the first semiconductor pattern 151 may function as a lower gate electrode of the first transistor T1. A portion of the first lower gate line 141 overlapping the second semiconductor pattern 152 may function as a lower gate electrode of the second transistor T2. A portion of the second lower gate line 142 overlapping the second semiconductor pattern 152 may function as a lower gate electrode of the third transistor T3. A portion of the third lower gate line 143 overlapping the first semiconductor pattern 151 may function as a lower gate electrode of the fourth transistor T4.

According to some example embodiments, the second semiconductor layer 151 and 152 may be formed of an oxide semiconductor. For example, after an oxide semiconductor layer is deposited on the third insulation layer, the oxide semiconductor layer may be patterned to form the second semiconductor layer 151 and 152.

Figure 10:
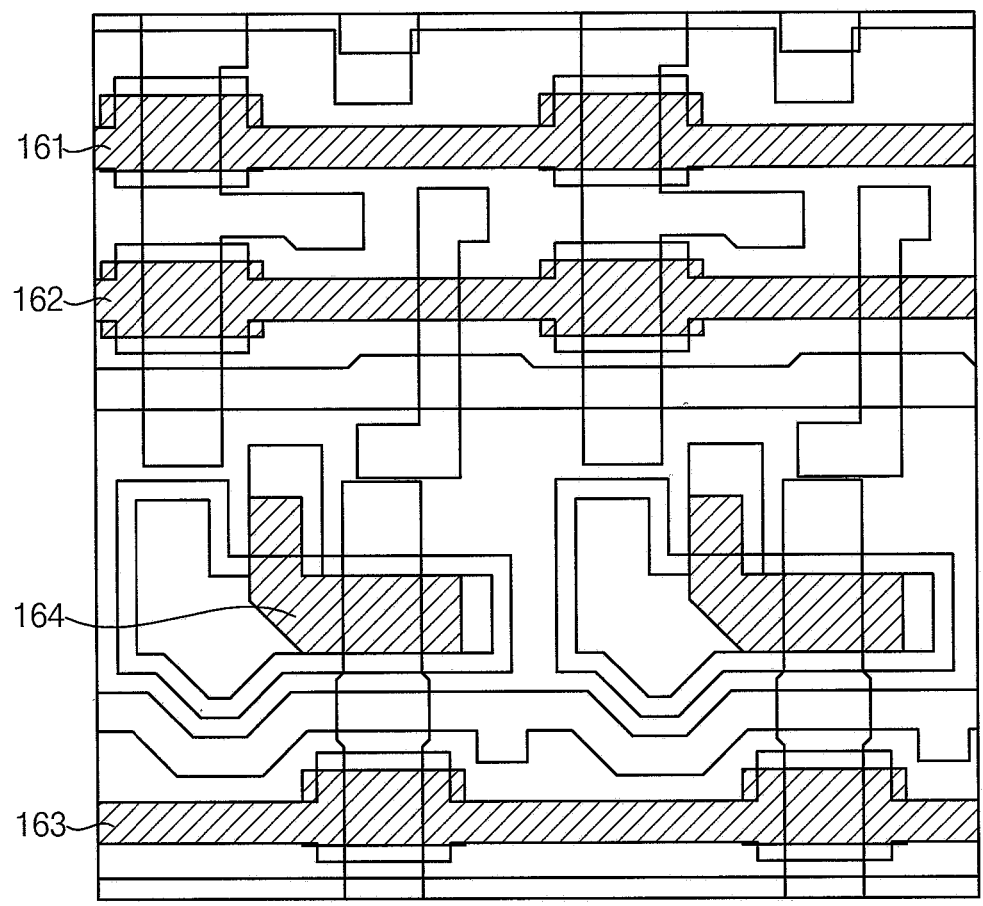

As illustrated in FIG. 10, the third conductive layer 161, 162, 163, and 164 may be located on the second semiconductor layer 151 and 152. A fourth insulation layer may be interposed between the second semiconductor layer 151 and 152 and the third conductive layer 161, 162, 163, and 164 to insulate therebetween. The fourth insulation layer may include silicon compounds, metal oxide, or the like.

The third conductive layer 161, 162, 163, and 164 may include a first upper gate line 161, a second upper gate line 162, a third upper gate line 163, and the first conductive pattern 164. The first upper gate line 161, the second upper gate line 162, and the third upper gate line 163 may substantially extend along the second direction DR2. A portion of the first conductive patter 164 overlapping the first semiconductor pattern 151 may function as an upper gate electrode of the first transistor T1. A portion of the first upper gate line 161 overlapping the second semiconductor pattern 152 may function as an upper gate electrode of the second transistor T2. A portion of the second upper gate line 162 overlapping the second semiconductor pattern 152 may function as an upper gate electrode of the third transistor T3. A portion of the third upper gate line 163 overlapping the first semiconductor pattern 151 may function as an upper gate electrode of the fourth transistor T4. The third conductive layer 161, 162, 163, and 164 may be formed of metal, alloy, metal nitride, conductive metal oxide, transparent conductive material, or the like.

The first capacitor electrode 133, the first semiconductor pattern 151, and the first conductive pattern 164 may form the first transistor T1, and the first lower gate line 141, the second semiconductor pattern 152, and the first upper gate line 161 may form the second transistor T2. The second lower gate line 142, the second semiconductor pattern 152, and the second upper gate line 162 may form the third transistor T3, and the third lower gate line 143, the first semiconductor pattern 151, and the third upper gate line 163 may form the fourth transistor T4.

Figure 11:
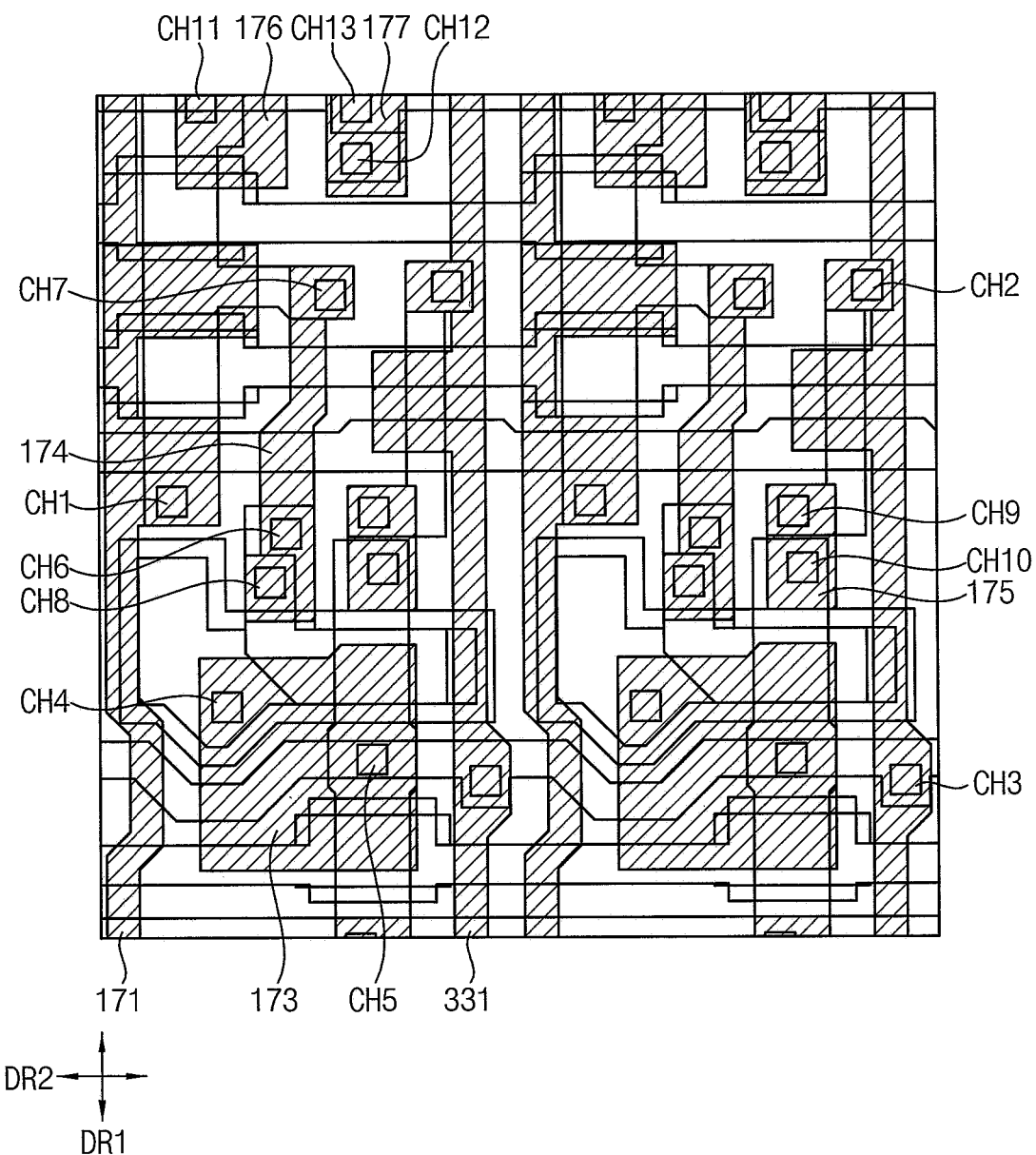

As illustrated in FIG. 11, the fourth conductive layer 171, 331, 173, 174, 175, 176, and 177 may be located on the third conductive layer 161, 162, 163, and 164. A fifth insulation layer may be interposed between the third conductive layer 161, 162, 163, and 164 and the fourth conductive layer 171, 331, 173, 174, 175, 176, and 177 to insulate therebetween. The fifth insulation layer may include silicon compounds, metal oxide, or the like.

The fourth conductive layer 171, 331, 173, 174, 175, 176, and 177 may include a reference voltage line 171, the first display driving voltage line 331, a second conductive pattern 173, a third conductive pattern 174, a fourth conductive pattern 175, a fifth conductive pattern 176, and a sixth conductive pattern 177. The reference voltage line 171 and the first display driving voltage line 331 may substantially extend along the first direction DR1. The reference voltage line 171 may be connected to the second semiconductor pattern 152 through a first contact hole CH1. The first display driving voltage line 331 may be connected to the first semiconductor layer 120 through a second contact hole CH2, and may be connected to the second display driving voltage line 332 through a third contact hole CH3. The second conductive pattern 173 may be connected to the second capacitor electrode 144 through a fourth contact hole CH4, and may be connected to the first semiconductor pattern 151 through a fifth contact hole CH5. The third conductive pattern 174 may be connected to the first capacitor electrode 133 through a sixth contact hole CH6, may be connected to the second semiconductor pattern 152, and may be connected to the first conductive pattern 164 through an eighth contact hole CH8. The fourth conductive pattern 175 may be connected to the first semiconductor layer 120 through a ninth contact hole CH9, and may be connected to the second semiconductor pattern 152 through a tenth contact hole CH10. The fifth conductive pattern 176 may be connected to the second semiconductor pattern 152 through an eleventh contact hole CH11. The sixth conductive pattern 177 may be connected to the initialization voltage line 131 through a twelfth contact hole CH12, and may be connected to the first semiconductor pattern 151 through a thirteenth contact hole CH13. The fourth conductive layer 171, 331, 173, 174, 175, 176, and 177 may be formed of metal, alloy, metal nitride, conductive metal oxide, transparent conductive material, or the like.

Figure 12:
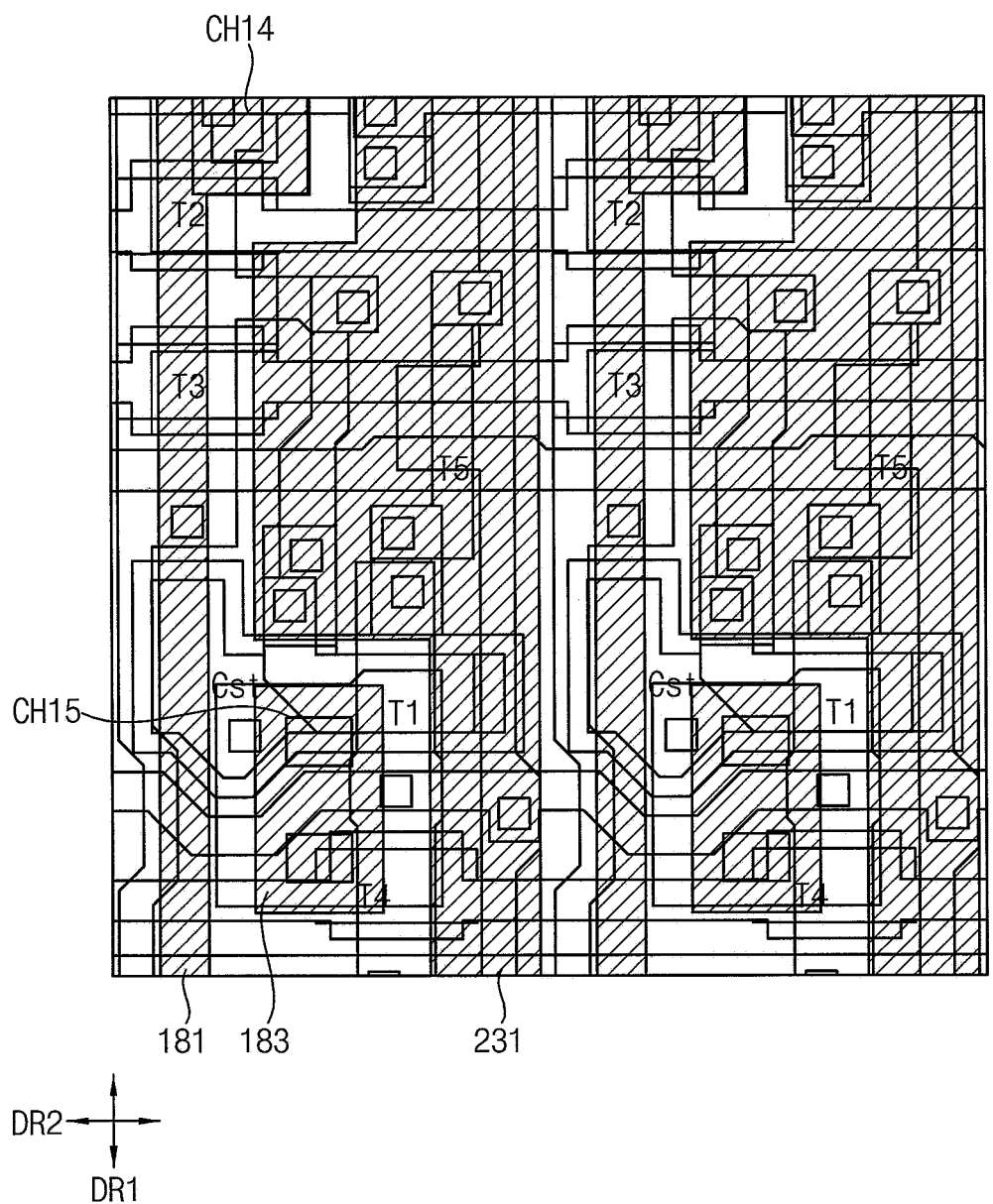

As illustrated in FIG. 12, the fifth conductive layer 181, 231, and 183 may be located on the fourth conductive layer 171, 331, 173, 174, 175, 176, and 177. A sixth insulation layer may be interposed between the fourth conductive layer 171, 331, 173, 174, 175, 176, and 177 and the fifth conductive layer 181, 231, and 183 to insulate therebetween. The sixth insulation layer may include polyimide, or the like.

The fifth conductive layer 181, 231, and 183 may include a data line 181, the first display common voltage line 231, and a seventh conductive pattern 183. The data line 181 and the first display common voltage line 231 may substantially extend along the first direction DR1. The data line 181 may be connected to the fifth conductive pattern 176 through a fourteenth contact hole CH14. The seventh conductive pattern 183 may be connected to the second conductive pattern 173 through a fifteenth contact hole CH15. The fifth conductive layer 181, 231, and 183 may be formed of metal, alloy, metal nitride, conductive metal oxide, transparent conductive material, or the like.

As described above, the first display common voltage line 231 may extend along the first direction DR1 inside the pixel PX. According to some example embodiments, the first display common voltage line 231 may be located on substantially the same layer as that of the data line 181.

As described above, the first display driving voltage line 331 may extend along the first direction DR1 inside the pixel PX, and the second display driving voltage line 332 may extend along the second direction DR2 inside the pixel PX. According to some example embodiments, the first display driving voltage line 331 may be located on substantially the same layer as that of the reference voltage line 171, and the second display driving voltage line 332 may be located on substantially the same layer as those of the initialization voltage line 131, the emission control line 132, and the first capacitor electrode 133. The first display driving voltage line 331 and the second driving voltage line 332 which are located on different layers from each other may be connected via the third contact hole CH3.

Figure 13:
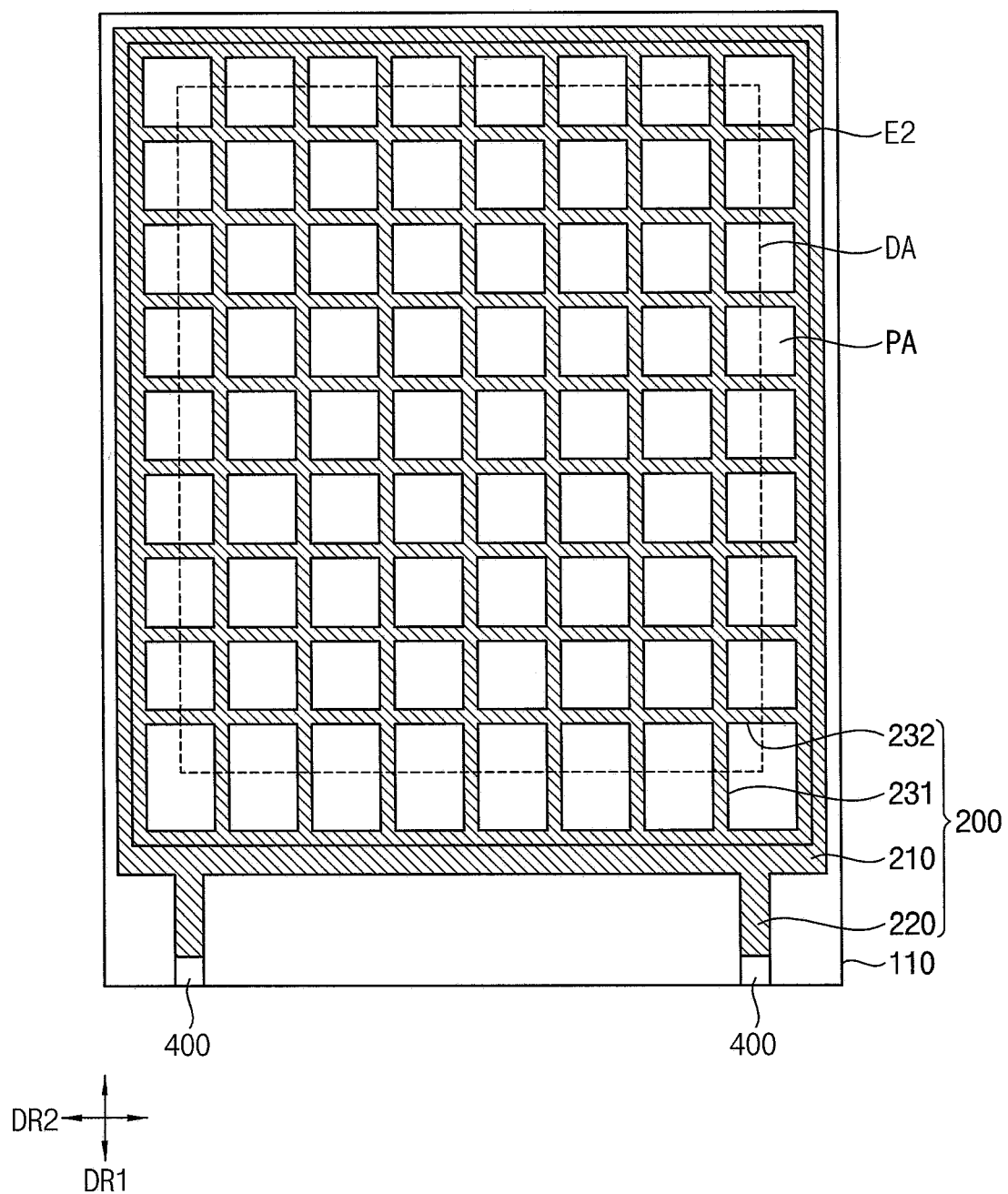
FIG. 13 is a plan view illustrating an example of a common voltage line included in the display device in FIG. 1.
Figure 14:
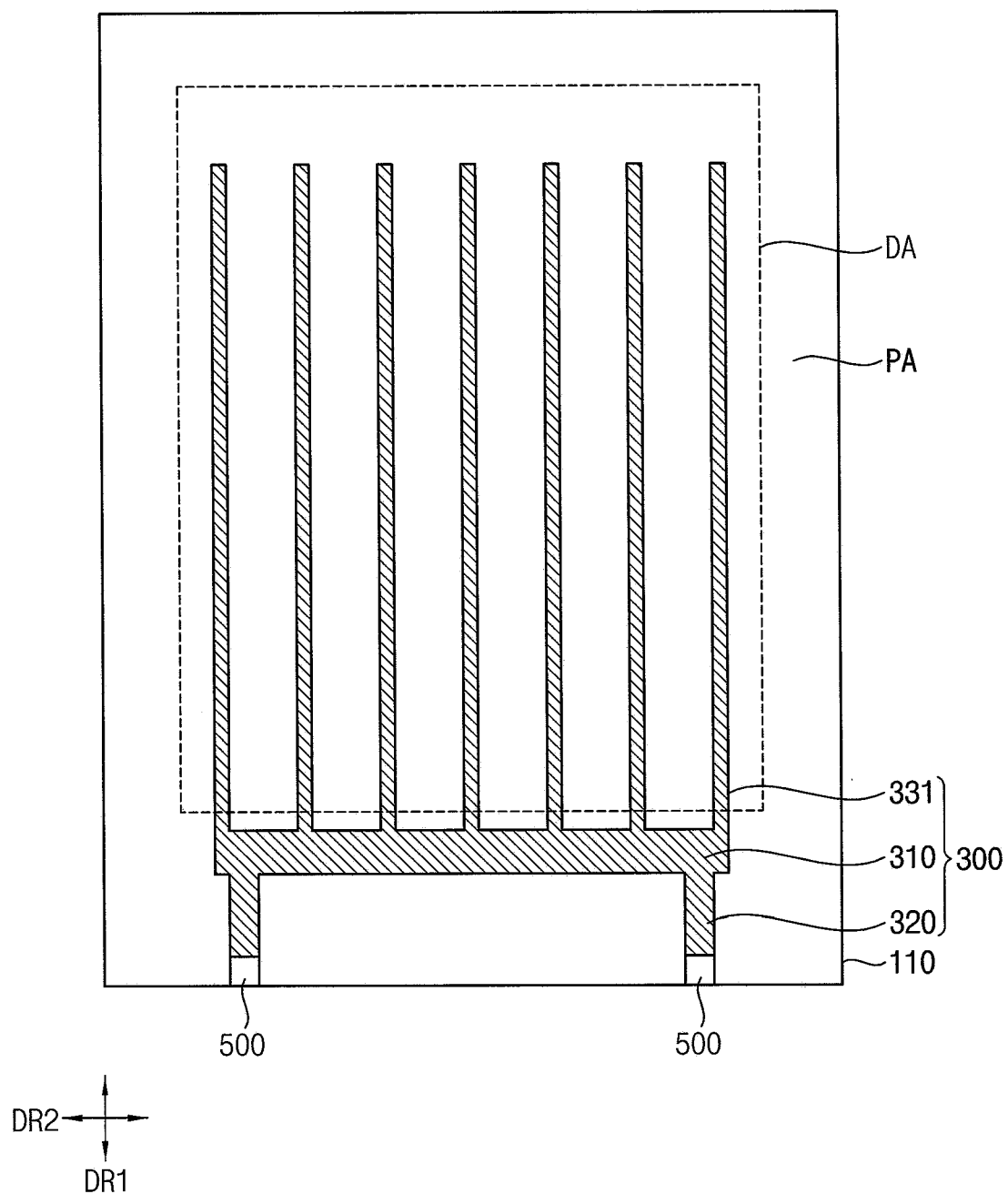
FIG. 14 is a plan view illustrating an example of a driving voltage line included in the display device in FIG. 1.

FIG. 13 is a plan view illustrating another example of a common voltage line included in the display device in FIG. 1. FIG. 14 is a plan view illustrating another example of a driving voltage line included in the display device in FIG. 1.

Referring to FIGS. 1, 13, and 14, a display device may include a substrate 110, a common voltage line 200, and a driving voltage line 300.

As illustrated in FIG. 13, the common voltage line 200 may be located on the substrate 110, and may provide the common voltage ELVSS to the pixels PX. The common voltage line 200 may include a peripheral common voltage line 210, a connecting common voltage line 220, and a plurality of display common voltage lines. According to some example embodiments, the plurality of display common voltage lines may include a plurality of first display common voltage lines 231 and a plurality of second display common voltage lines 232.

The first display common voltage lines 231 may cross the display area DA. Each of the first display common voltage lines 231 may contact different portions of the peripheral common voltage line 210. According to some example embodiments, the first display common voltage lines 231 may extend along the first direction DR1, and each of the first display common voltage lines 231 may contact facing portions of the peripheral common voltage line 210 with respect to the display area DA. For example, each of the first display common voltage lines 231 may contact the upper side and the lower side of the peripheral common voltage line 210.

The second display common voltage lines 232 may cross the display area DA. Each of the second display common voltage lines 232 may contact different portions of the peripheral common voltage line 210. According to some example embodiments, the second display common voltage lines 232 may extend along the second direction DR2, and each of the second display common voltage lines 232 may contact facing portions of the peripheral common voltage line 210 with respect to the display area DA. For example, each of the second display common voltage lines 232 may contact the left side and the right side of the peripheral common voltage line 210.

According to some example embodiments, the second display common voltage lines 232 may be located on a different layer from that of the first display common voltage lines 231. Each of the second display common voltage lines 232 may be connected to the first display common voltage lines 231 that are located on a different layer through a contact hole.

According to some example embodiments, the first display common voltage lines 231 and the second display common voltage lines 232 may be spaced apart from (or not directly contact) the common electrode E2 of the light emitting element LE. As mentioned above, since the peripheral common voltage line 210 is connected to the common electrode E2 of the light emitting element LE in the peripheral area PA, although the first display common voltage lines 231 and the second display common voltage lines 232 are spaced apart from (or do not directly contact) the common electrode E2 of the light emitting element LE, the common voltage ELVSS may be provided to the common electrode E2 of the light emitting element LE.

An electric current generated in the common electrode E2 of the light emitting element LE inside the display area DA may be moved to the common electrode E2 inside the peripheral area PA, and the electric current may flow from the upper side to the lower side of the peripheral common voltage line 210 along the first display common voltage line 231 crossing the display area DA, or may flow from the left side to the right side of the peripheral common voltage line 210 along the second display common voltage line 232 crossing the display area DA. Accordingly, a voltage drop of the common voltage ELVSS may be minimized or reduced. Further, luminance uniformity of the display device may be improved by minimizing or reducing the voltage drop of the common voltage ELVSS.

As illustrated in FIG. 14, the driving voltage line 300 may be located on the substrate 110, and may provide the driving voltage ELVDD to the pixels PX. The driving voltage line 300 may include a peripheral driving voltage line 310, a connecting driving voltage line 320, and a plurality of display driving voltage lines. According to some example embodiments, the plurality of display driving voltage lines may include a plurality of first display driving voltage lines 331.

The first display driving voltage lines 331 may be located on a different layer from those of the first display common voltage lines 231 and the second display common voltage lines 232 inside the display area DA. Accordingly, the first display driving voltage lines 331 may be insulated from the first and second display common voltage lines 231 and 232.

Figure 15:
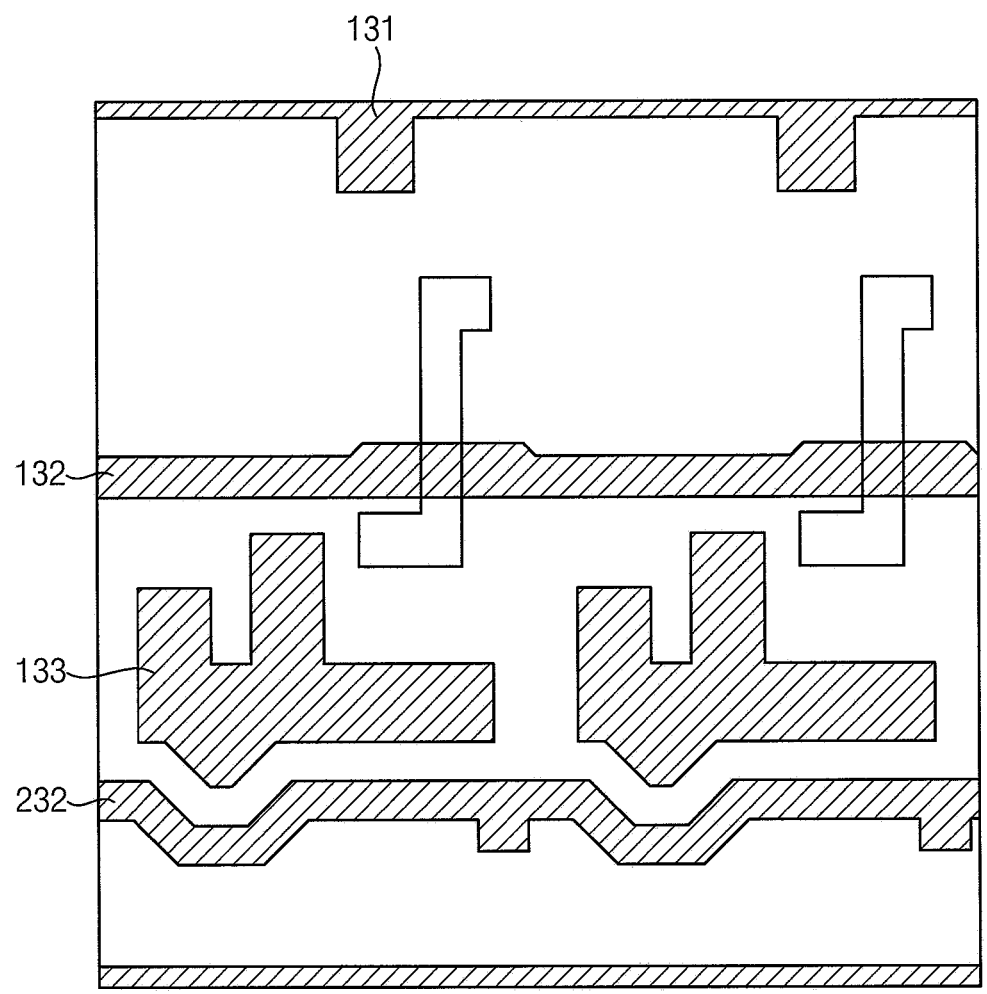
FIGS. 15, 16, and 17 are layout diagrams illustrating an example of realizing the pixel in FIG. 4.
Figure 16:
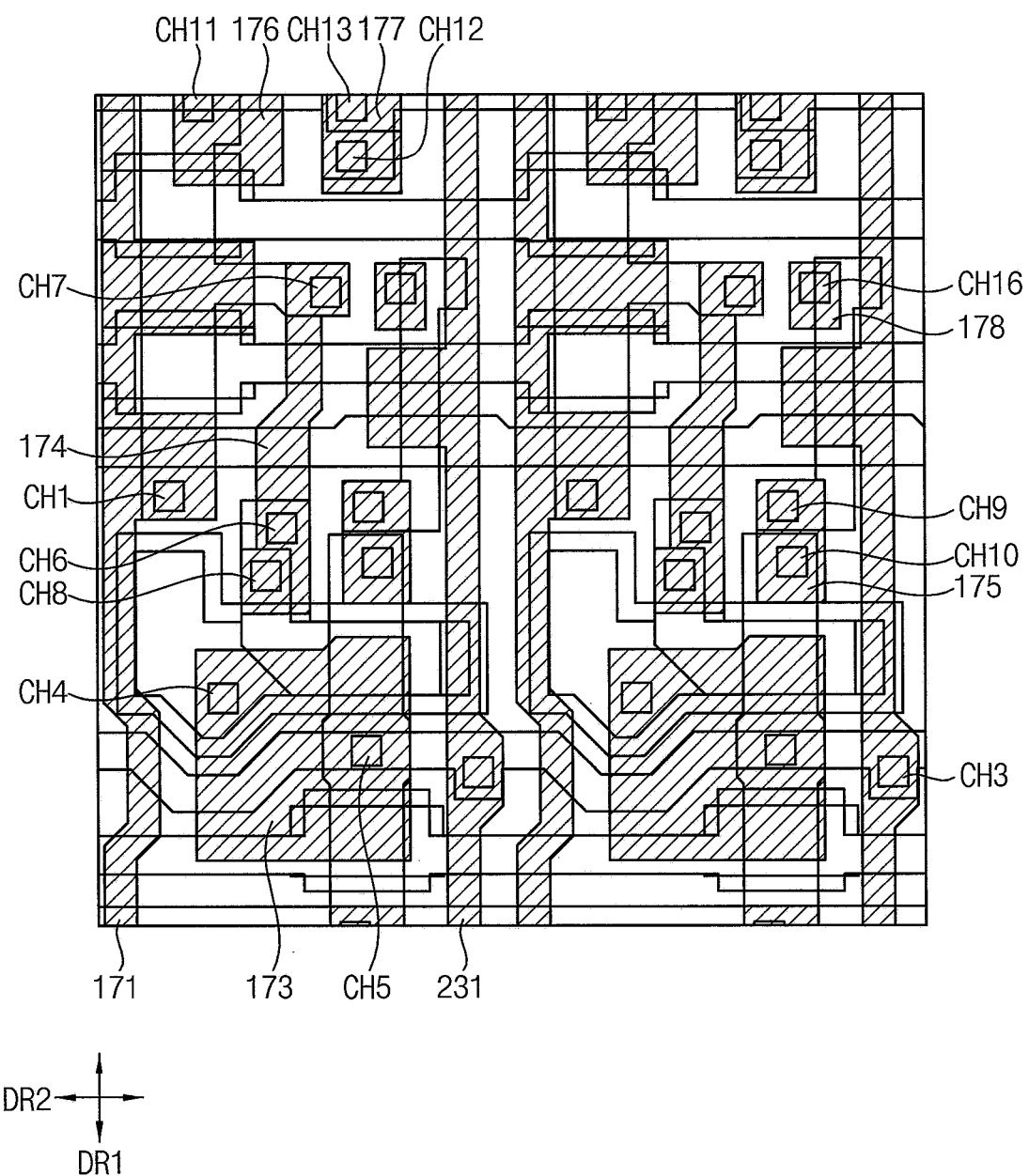
Figure 17:
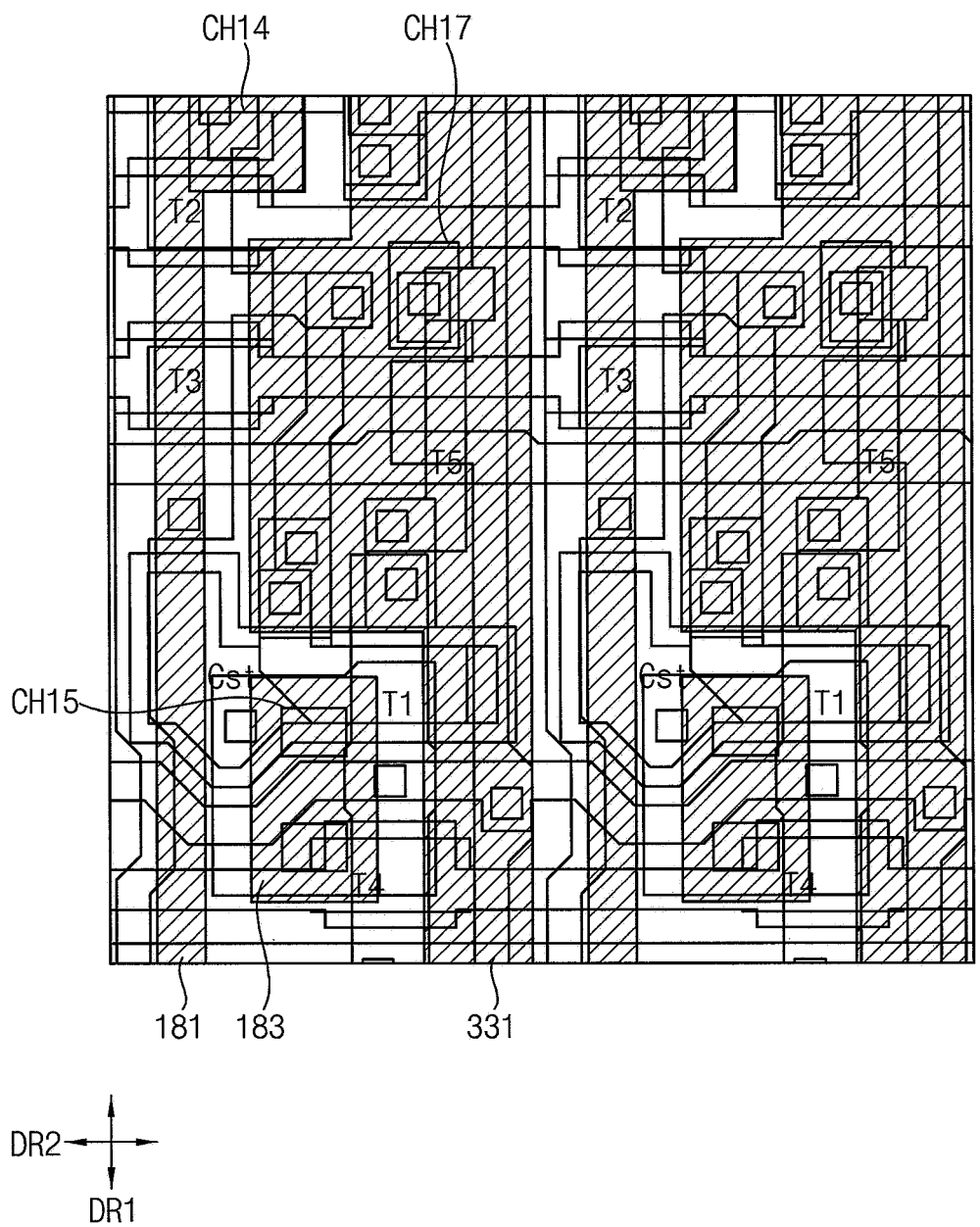

FIGS. 15, 16, and 17 are layout diagrams illustrating another example of realizing the pixel PX in FIG. 4.

Referring to FIGS. 6, 8 to 10, and 15 to 17, a first semiconductor layer 120, a first conductive layer 131, 132, 133, and 232, a second conductive layer 141, 142, 143, and 144, a second semiconductor layer 151 and 152, a third conductive layer 161, 162, 163, and 164, a fourth conductive layer 171, 231, 173, 174, 175, 176, 177, and 178, and a fifth conductive layer 181, 331, and 183 may be sequentially located on the substrate 110. The first semiconductor layer 120, the first conductive layer 131, 132, 133, and 232, the second conductive layer 141, 142, 143, and 144, the second semiconductor layer 151 and 152, the third conductive layer 161, 162, 163, and 164, the fourth conductive layer 171, 231, 173, 174, 175, 176, 177, and 178, and the fifth conductive layer 181, 331, and 183 may form the first to fifth transistors T1, T2, T3, T4, and T5 and the storage capacitor Cst on the substrate 110.

As illustrated in FIG. 15, the first conductive layer 131, 132, 133, and 232 may be located on the first semiconductor layer 120. The first conductive layer 131, 132, 133, and 232 may include an initialization voltage line 131, an emission control line 132, a first capacitor electrode 133, and the second display common voltage line 232. The initialization voltage line 131, the emission control line 132, and the second display common voltage line 232 may substantially extend along the second direction DR2.

As illustrated in FIG. 16, the fourth conductive layer 171, 231, 173, 174, 175, 176, 177, and 178 may be located on the third conductive layer 161, 162, 163, and 164. The fourth conductive layer 171, 231, 173, 174, 175, 176, 177, and 178 may include a reference voltage line 171, the first display common voltage line 231, a second conductive pattern 173, a third conductive pattern 174, a fourth conductive pattern 175, a fifth conductive pattern 176, a sixth conductive pattern 177, and an eighth conductive pattern 178. The reference voltage line 171 and the first display common voltage line 231 may substantially extend along the first direction DR1. The first display common voltage line 231 may be connected to the second display common voltage line 232 through a third contact hole CH3. The eighth conductive pattern 178 may be connected to the first semiconductor layer 120 through a sixteenth contact hole CH16.

As illustrated in FIG. 17, the fifth conductive layer 181, 331, and 183 may be located on the fourth conductive layer 171, 331, 173, 174, 175, 176, 177, and 178. The fifth conductive layer 181, 331, and 183 may include a data line 181, the first display driving voltage line 331, and a seventh conductive pattern 183. The data line 181 and the first display driving voltage line 331 may substantially extend along the first direction DR1. The first display driving voltage line 331 may be connected to the eighth conductive pattern 178 through a seventeenth contact hole CH17.

As described above, the first display common voltage line 231 may extend along the first direction DR1 inside the pixel PX, and the second display common voltage line 232 may extend along the second direction DR2 inside the pixel PX. According to some example embodiments, the first display common voltage line 231 may be located on substantially the same layer as that of the reference voltage line 171, and the second display common voltage line 232 may be located on substantially the same layer as those of the initialization voltage line 131, the emission control line 132, and the first capacitor electrode 133. The first display common voltage line 231 and the second display common voltage line 232 which are located on different layers from each other may be connected through the third contact hole CH3.

As described above, the first display driving voltage line 331 may extend along the first direction DR1 inside the pixel PX. According to some example embodiments, the first display driving voltage line 331 may be located on substantially the same layer as that of the data line 181.

The display device according to the embodiments may be applied to a display device included in a computer, a notebook, a mobile phone, a smartphone, a smart pad, a PMP, a PDA, an MP3 player, or the like.

Although the display device according to some example embodiments have been described with reference to the drawings, the illustrated embodiments are examples, and may be modified and changed by a person having ordinary knowledge in the relevant technical field without departing from the technical spirit described in the following claims, and their equivalents.

What is claimed is:

1. A display device, comprising:
a substrate including a display area at which a pixel including a light emitting element is located and a peripheral area surrounding the display area; and
a common voltage line on the substrate, the common voltage line configured to provide a common voltage to the pixel, the common voltage line including:
a peripheral common voltage line on the peripheral area of the substrate to surround the display area and connected to a common electrode of the light emitting element; and
a plurality of display common voltage lines crossing the display area and each contacting different portions of the peripheral common voltage line, the display common voltage lines being spaced apart from the common electrode of the light emitting element; and
a driving voltage line configured to provide a driving voltage to the pixel, the driving voltage line including:
a peripheral driving voltage line on the peripheral area of the substrate to correspond to a side of the display area; and
a plurality of display driving voltage lines crossing the display area, the display driving voltage lines being connected to the peripheral driving voltage line and connected to a pixel electrode of the light emitting element.

2. The display device of claim 1, wherein the display common voltage lines include a plurality of first display common voltage lines extending along a first direction and each contacting facing portions of the peripheral common voltage line with respect to the display area.

3. The display device of claim 2, further comprising a data line crossing the display area along the first direction and configured to provide a data signal to the pixel,
wherein the first display common voltage lines are on a same layer as that of the data line.

4. The display device of claim 2, further comprising a reference voltage line crossing the display area along the first direction and configured to provide a reference voltage to the pixel,
wherein the first display common voltage lines are on a same layer as that of the reference voltage line.

5. The display device of claim 2, wherein the display common voltage lines further include a plurality of second display common voltage lines extending along a second direction crossing the first direction and each contacting facing portions of the peripheral common voltage line with respect to the display area.

6. The display device of claim 5, wherein the second display common voltage lines are on a different layer from that of the first display common voltage lines, and wherein each of the second display common voltage lines is connected to the first display common voltage lines through a contact hole.

7. The display device of claim 5, wherein the second display common voltage lines are on a same layer as that of an electrode of a capacitor included in the pixel.

8. The display device of claim 1, wherein the peripheral common voltage line has a closed shape surrounding the display area.

9. The display device of claim 1, further comprising a peripheral conductive layer in the peripheral area between the peripheral common voltage line and the common electrode of the light emitting element to surround the display area,
wherein the peripheral common voltage line is connected to the common electrode of the light emitting element through the peripheral conductive layer.

10. The display device of claim 9, wherein the peripheral conductive layer is on a same layer as that of a pixel electrode of the light emitting element.

11. The display device of claim 1, wherein the pixel includes a first transistor configured to provide a driving current to the light emitting element, and
wherein the first transistor is an n-type transistor.

12. The display device of claim 11, wherein the first transistor includes an oxide semiconductor.

13. The display device of claim 11, wherein the pixel further includes:
a second transistor configured to provide a data signal to the first transistor;
a third transistor configured to provide a reference voltage to the first transistor; and
a fourth transistor configured to provide an initialization voltage to the light emitting element,
wherein the second transistor, the third transistor, and the fourth transistor are n-type transistors.

14. The display device of claim 13, wherein the second transistor, the third transistor, and the fourth transistor include an oxide semiconductor.

15. The display device of claim 11, wherein the pixel further includes a fifth transistor configured to provide a driving voltage to the light emitting element, and
wherein the fifth transistor is a p-type transistor.

16. The display device of claim 15, wherein the fifth transistor includes polycrystalline silicon.

17. The display device of claim 1, wherein the display driving voltage lines are on a different layer from the display common voltage lines.

18. The display device of claim 1, wherein the display driving voltage lines include a plurality of first display driving voltage lines extending along a first direction and connected to the peripheral driving voltage line.

19. The display device of claim 18, wherein the display driving voltage lines further include a plurality of second display driving voltage lines extending along a second direction crossing the first direction and respectively connected to the first display driving voltage lines.

* * * * *